(12) United States Patent
Min et al.

(10) Patent No.: US 12,069,896 B2
(45) Date of Patent: Aug. 20, 2024

(54) DISPLAY PANEL AND ELECTRONIC DEVICE

(71) Applicant: Samsung Display Co., Ltd., Yongin-Si (KR)

(72) Inventors: Junyoung Min, Yongin-si (KR); Jaewon Kim, Yongin-si (KR); Junwon Choi, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 396 days.

(21) Appl. No.: 17/577,995

(22) Filed: Jan. 18, 2022

(65) Prior Publication Data
US 2023/0020515 A1 Jan. 19, 2023

(30) Foreign Application Priority Data
Jul. 16, 2021 (KR) .................. 10-2021-0093687

(51) Int. Cl.
*H01L 27/14* (2006.01)
*H01L 29/786* (2006.01)
*H10K 59/121* (2023.01)

(52) U.S. Cl.
CPC ..... *H10K 59/1213* (2023.02); *H01L 29/7869* (2013.01); *H10K 59/1216* (2023.02)

(58) Field of Classification Search
CPC .......... H10K 59/1213; H10K 59/1216; H10K 50/844; H10K 59/131; H10K 59/126; H10K 59/65; H10K 59/88; H10K 59/00; H10K 59/121; H01L 29/7869; H01L 27/124; G09G 3/3225
USPC .............................................. 257/43, 59, 72
See application file for complete search history.

(56) References Cited

U.S. PATENT DOCUMENTS

| | | |
|---|---|---|
| 10,050,097 B2 | 8/2018 | Oh et al. |
| 10,964,771 B2 | 3/2021 | Lee et al. |
| 11,101,340 B2 | 8/2021 | Sung et al. |
| 11,282,900 B2 | 3/2022 | An et al. |
| 2021/0193781 A1 | 6/2021 | Shim et al. |
| 2022/0320232 A1* | 10/2022 | Yang .................... G09G 3/3233 |

FOREIGN PATENT DOCUMENTS

| | | |
|---|---|---|
| CN | 109087938 A | 12/2018 |
| EP | 3660827 A1 | 6/2020 |
| EP | 3664145 A1 | 6/2020 |
| JP | 5754207 B2 | 7/2015 |
| KR | 20170049705 A | 5/2017 |
| KR | 20200051108 A | 5/2020 |

* cited by examiner

*Primary Examiner* — Tan N Tran
(74) *Attorney, Agent, or Firm* — Innovation Counsel LLP

(57) ABSTRACT

A display panel includes a substrate including a first opening and a second opening that are spaced apart from each other, a plurality of pixels located in a display area around the first opening and the second opening, each of the plurality of pixels including a pixel circuit including a first thin-film transistor, and a display element connected to the pixel circuit, a bottom metal layer located between the substrate and the first thin-film transistor, emission control lines located on the substrate, extending in a first direction and spaced apart from each other by the first opening and the second opening, and a first conductive layer located in an intermediate area surrounding each of the first opening and the second opening to bypass the first opening and the second opening.

25 Claims, 22 Drawing Sheets

DISPLAY PANEL AND ELECTRONIC DEVICE

CROSS-REFERENCE TO RELATED APPLICATION

This application is based on and claims priority under 35 U.S.C. § 119 to Korean Patent Application No. 10-2021-0093687, filed on Jul. 16, 2021, in the Korean Intellectual Property Office, the disclosure of which is incorporated by reference herein in its entirety.

BACKGROUND

1. Field

One or more embodiments relate to a display panel and an electronic device, and more particularly, to a display panel and an electronic device including an area for a component in a display area.

2. Description of the Related Art

Recently, display panels have been used for various purposes. Also, as thicknesses and weights of display panels have decreased, the range of applications of display panels has increased.

As an area occupied by a display area in a display panel increases, various functions linked to or associated with the display panel are added. In order to add various functions while increasing the display area, research is being conducted to use a part of a display area for functions other than a function of displaying an image.

SUMMARY

One or more embodiments include a display panel and an electronic device including an area for a component in a display area. However, the embodiments are examples, and do not limit the scope of the disclosure.

Additional aspects will be set forth in part in the description which follows and, in part, will be apparent from the description, or may be learned by practice of the presented embodiments.

According to one or more embodiments, a display panel includes a substrate including a first opening and a second opening that are spaced apart from each other, a plurality of pixels located in a display area around the first opening and the second opening, each of the plurality of pixels including a pixel circuit including a first thin-film transistor and a display element connected to the pixel circuit, a bottom metal layer located between the substrate and the first thin-film transistor, emission control lines located on the substrate, extending in a first direction, and spaced apart from each other by the first opening and the second opening, and a first conductive layer located in an intermediate area surrounding each of the first opening and the second opening to bypass the first opening and the second opening, wherein the first conductive layer electrically connects the emission control lines that are spaced apart from each other by the first opening and the second opening, and the first conductive layer includes a same material as a material of the bottom metal layer.

The first conductive layer may be located directly on the substrate.

The first thin-film transistor may include a first semiconductor layer including a silicon-based semiconductor, a first gate electrode at least partially overlapping the first semiconductor layer, and a first electrode layer disposed on the first gate electrode, and the bottom metal layer is located between the first semiconductor layer and the substrate to at least partially overlap the first semiconductor layer.

The first conductive layer and the bottom metal layer may be located on a same layer.

The bottom metal layer may include molybdenum (Mo).

The bottom metal layer may include a same material as a material of the first gate electrode.

The display panel may further include a bridge layer located on the first conductive layer and the emission control lines, wherein the bridge layer connects one of the emission control lines and the first conductive layer.

The bridge layer may include a same material as a material of the first electrode layer.

The emission control lines may include a same material as a material of the first gate electrode.

The pixel circuit may further include a second thin-film transistor and a storage capacitor, wherein the second thin-film transistor includes an oxide-based semiconductor.

The second thin-film transistor may include a second semiconductor layer, a second gate electrode at least partially overlapping the second semiconductor layer, and a second electrode layer disposed on the second gate electrode, and the storage capacitor may include a lower electrode that is a part of the first gate electrode and an upper electrode disposed on the lower electrode to overlap the lower electrode in a plan view.

The first gate electrode, the upper electrode, and the second gate electrode may be located on different layers and include a same material.

The display panel may further include an emission control driving circuit located in a first peripheral area surrounding the display area, wherein the emission control lines receive a signal from the emission control driving circuit.

The plurality of pixels may include a first pixel located in a display area between the first opening and the first peripheral area, a second pixel located in a separation area between the first opening and the second opening, and a third pixel located in a display area between the second opening and a second peripheral area which is disposed opposite to the first peripheral area with the display area disposed between the first peripheral area and the second peripheral area, wherein the emission control lines are electrically connected to the first pixel, the second pixel, and the third pixel.

The emission control lines may include a first portion located in the display area between the first opening and the first peripheral area and electrically connected to the first pixel, a second portion located in the separation area between the first opening and the second opening and electrically connected to the second pixel, and a third portion located in the display area between the second opening and the second peripheral area and electrically connected to the third pixel.

The first conductive layer bypassing the first opening may be electrically connected to the first portion and the second portion.

The first conductive layer bypassing the second opening may be electrically connected to the second portion and the third portion.

The display panel may further include first scan lines located on the substrate and extending in the first direction, and a second conductive layer located in the intermediate area to bypass the first opening and the second opening, wherein the second conductive layer electrically connects the first scan lines that are spaced apart from each other by the first opening and the second opening.

The second conductive layer may include a first layer and a second layer located on the first layer and electrically connected to the first layer.

The first thin-film transistor may include a first semiconductor layer, a first gate electrode at least partially overlapping the first semiconductor layer, and a first electrode disposed on the first gate electrode, wherein the first layer includes a same material as a material of the first gate electrode.

The pixel circuit may further include a second thin-film transistor including a second semiconductor layer, a second gate electrode at least partially overlapping the second semiconductor layer, and a second electrode layer disposed on the second gate electrode, wherein the second layer includes a same material as a material of the second gate electrode.

A constant voltage may be applied to the bottom metal layer.

According to one or more embodiments, an electronic device includes a display panel including a display area and at least two opening areas that are located inside the display area and are spaced apart from each other, and a component overlapping the at least two opening areas, wherein the display panel includes a substrate including a first opening and a second opening respectively corresponding to the at least two opening areas, a plurality of pixels located in the display area around the first opening and the second opening, and each including a pixel circuit including a first thin-film transistor and a display element connected to the pixel circuit, a bottom metal layer located between the substrate and the first thin-film transistor, emission control lines located on the substrate, extending in a first direction, and spaced apart from each other by the first opening and the second opening, and a first conductive layer located in the intermediate layer surrounding each of the first opening and the second opening to bypass the first opening and the second opening, wherein the first conductive layer electrically connects the emission control lines that are spaced apart from each other by the first opening and the second opening, and includes a same material as a material of the bottom metal layer.

The first conductive layer may be located directly on the substrate.

The first conductive layer and the bottom metal layer may be located on a same layer.

Other aspects, features, and advantages of the disclosure will become more apparent from the drawings, the claims, and the detailed description.

BRIEF DESCRIPTION OF THE DRAWINGS

The above and other aspects, features, and advantages of certain embodiments will be more apparent from the following description taken in conjunction with the accompanying drawings, in which.

DETAILED DESCRIPTION

Figure 1:
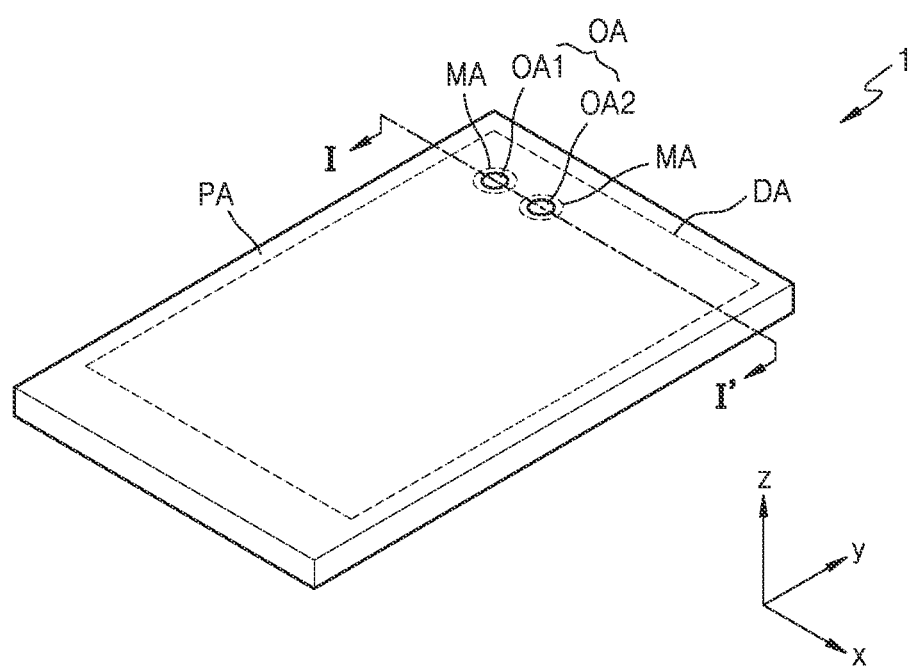
FIG. 1 is a perspective view illustrating an electronic device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the disclosure allows for various changes and numerous embodiments, certain embodiments will be illustrated in the drawings and described in the detailed description. Effects and features of the disclosure, and methods for achieving them will be clarified with reference to embodiments described below in detail with reference to the drawings. However, the disclosure is not limited to the following embodiments and may be embodied in various forms.

Hereinafter, embodiments will be described in detail with reference to the accompanying drawings, wherein the same or corresponding elements are denoted by the same reference numerals throughout and a repeated description thereof is omitted.

While such terms as "first," "second," etc., may be used to describe various components, such components are not be limited to the above terms. The above terms are used only to distinguish one component from another.

In the following embodiments, an expression used in the singular encompasses the expression of the plural, unless it has a clearly different meaning in the context.

In the following embodiments, it is to be understood that the terms "including," "having," and "comprising" are intended to indicate the existence of features or components described in the specification, and are not intended to preclude the possibility that one or more other features or components may be added.

It will be further understood that, when a layer, region, or component is referred to as being "on" another layer, region, or component, it may be directly on the other layer, region, or component, or may be indirectly on the other layer, region, or component with intervening layers, regions, or components therebetween.

It will be understood that when a layer, an area, or an element is referred to as being "connected" to another layer, area, or element, it may be "directly connected" to the other layer, area, or element and/or may be "indirectly connected" to the other layer, area, or element with other layers, areas, or elements interposed therebetween. For example, when a layer, an area, or an element is referred to as being "electrically connected," it may be directly electrically connected, and/or may be indirectly electrically connected with intervening layers, areas, or elements therebetween.

"A and/or B" is used herein to select only A, select only B, or select both A and B. "At least one of A and B" is used to select only A, select only B, or select both A and B.

In the following embodiments, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When a certain embodiment may be implemented differently, a specific process order may be different from the described order. For example, two consecutively described processes may be performed substantially at the same time or may be performed in an order opposite to the described order.

Sizes of components in the drawings may be exaggerated or contracted for convenience of explanation. For example, because sizes and thicknesses of elements in the drawings are arbitrarily illustrated for convenience of explanation, the disclosure is not limited thereto.

Hereinafter, although an organic light-emitting display apparatus is described as an electronic device 1 according to an embodiment, the electronic device 1 of the disclosure is not limited thereto. In another embodiment, the electronic device 1 may be an inorganic light-emitting display apparatus or an inorganic electroluminescent (EL) display apparatus, or a quantum dot light-emitting display. For example, an emission layer of a display element included in the electronic device 1 may include an organic material, may include an inorganic material, may include quantum dots, may include an organic material and quantum dots, or may include an inorganic material and quantum dots.

FIG. 1 is a perspective view illustrating an electronic device, according to an embodiment.

Referring to FIG. 1, the electronic device 1 for displaying a moving image or a still image may be used as a display screen of not only a portable electronic device such as a mobile phone, a smartphone, a tablet personal (PC) computer, a mobile communication terminal, an electronic organizer, an electronic book, a portable multimedia player (PMP), a navigation device, or an ultra-mobile PC (UMPC) but also any of various products such as a television, a laptop computer, a monitor, an advertisement board, or an Internet of things (IoT) product. Also, the electronic device 1 according to an embodiment may be used in a wearable device such as a smart watch, a watch phone, a glasses-type display, or a head-mounted display (HMD). Also, the electronic device 1 according to an embodiment may be used as a center information display (CID) located on an instrument panel, a center fascia, or a dashboard of a vehicle, a room mirror display replacing a side-view mirror of a vehicle, or a display located on the back of a front seat for entertainment for a back seat of a vehicle. For convenience of explanation, the electronic device 1 according to an embodiment is a smartphone in FIG. 1.

The electronic device 1 may have a rectangular shape in a plan view. For example, as shown in FIG. 1, the electronic device 1 may have a rectangular shape having a short side in an x direction and a long side in a y direction in a plan view. A corner where the short side in the x direction and the long side in the y direction meet each other may be rounded to have a certain curvature or formed to have a right angle. However, a planar shape of the electronic device 1 is not limited to a rectangular shape, and may be any of other shapes such as another polygonal shape, an elliptical shape, or an irregular shape.

The electronic device 1 may include at least two opening areas OA (or first areas), and a display area DA (or a second area) at least partially surrounding the opening areas OA. The electronic device 1 may include an intermediate area MA (or a third area) located between each of the opening areas OA and the display area DA, and a peripheral area PA (or a fourth area) surrounding the display area DA.

The opening areas OA may be located inside the display area DA. The opening areas OA may include a first opening area OA1 and a second opening area OA2 that are spaced apart from each other. In an embodiment, the first opening area OA1 and the second opening area OA2 may be located on an upper left portion of the display area DA as shown in FIG. 1. Alternatively, the first opening area OA1 and the second opening area OA2 may be located in various ways. For example, the first opening area OA1 and the second opening area OA2 may be located on a central portion of the display area DA or may be located on an upper right portion of the display area DA. In the specification, "left," "right," "upper," and "lower" directions in a plan view refer to directions when the electronic device 1 is vertically seen. For example, "left" refers to a −x direction, "right" refers to a +x direction, "upper" refers to a +y direction, and "lower" refers to a −y direction.

Figure 2:
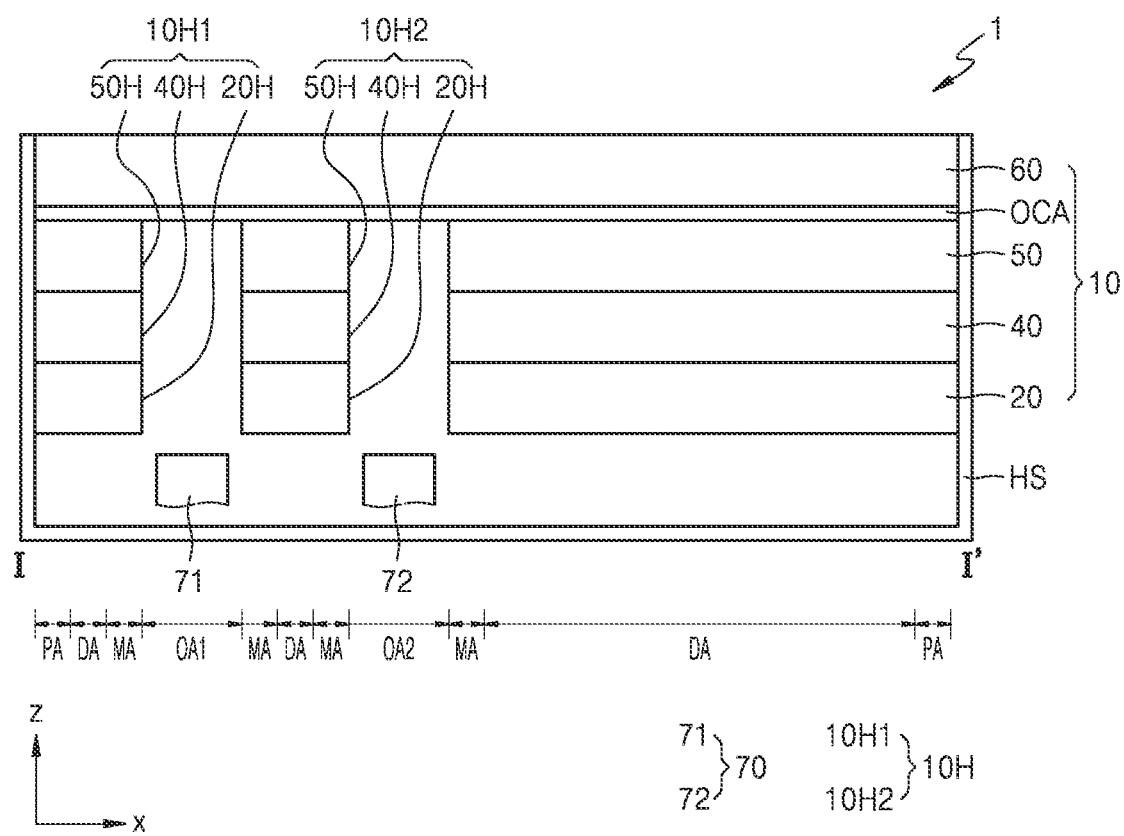
FIG. 2 is a cross-sectional view illustrating a display panel, taken along line I-I' of FIG. 1 according to an embodiment.

FIG. 2 is a cross-sectional view illustrating a display panel, taken along line I-I' of FIG. 1, according to an embodiment.

Referring to FIG. 2, the electronic device 1 may include a display panel 10 and a component 70 located in an area corresponding to the opening area OA of the display panel 10. The display panel 10 and the component 70 may be received in a housing HS.

The display panel 10 may include a display element layer 20, an input sensing layer 40, an optical functional layer 50, and a cover window 60.

The display element layer 20 may include display elements (or light-emitting elements) that emit light to display an image. The display element may include a light-emitting diode, for example, an organic light-emitting diode including an organic emission layer. In another embodiment, the light-emitting diode may be an inorganic light-emitting diode including an inorganic material. The inorganic light-emitting diode may include a PN diode including inorganic semiconductor-based materials. When a voltage is applied to a PN junction diode in a forward direction, holes and electrons may be injected, and energy generated by recombination of the holes and electrons may be converted into light energy to emit light of a certain color. The inorganic light-emitting diode may have a width of several to hundreds of micrometers, and in some embodiments, the inorganic light-emitting diode may be referred to as a micro-LED. In some embodiments, the display element layer 20 may include a quantum dot light-emitting diode. For example, an emission layer of the display element layer 20 may include an organic material, may include an inorganic material, may include quantum dots, may include an organic material and quantum dots, or may include an inorganic material and quantum dots.

The input sensing layer 40 may obtain coordinate information according to an external input, for example, a touch event. The input sensing layer 40 may include a sensing electrode (or a touch electrode) and trace lines connected to the sensing electrode. The input sensing layer 40 may be located on the display element layer 20. The input sensing layer 40 may detect the external input by using a mutual capacitance method and/or a self-capacitance method.

The input sensing layer 40 may be formed directly on the display element layer 20, or may be separately formed and then may be coupled to the display element layer 20 through an adhesive layer such as an optical clear adhesive. For example, the input sensing layer 40 may be continuously formed after the display element layer 20 is formed, and in this case, the adhesive layer may not be located between the input sensing layer 40 and the display element layer 20. Although the input sensing layer 40 is located between the display element layer 20 and the optical functional layer 50 in FIG. 2, in another embodiment, the input sensing layer 40 may be located over the optical functional layer 50.

The optical functional layer 50 may include an anti-reflection layer. The anti-reflection layer may reduce a reflectance of light (external light) incident on the display panel 10 through the cover window 60. The anti-reflection layer may include a phase retarder and a polarizer. The phase retarder may be a film type phase retarder or a liquid crystal coating type phase retarder. The polarizer may also be a film type polarizer or a liquid crystal coating type polarizer. The film type polarizer may include a stretchable synthetic resin film and the liquid crystal coating type polarizer may include liquid crystals arranged with a certain orientation.

In another embodiment, the anti-reflection layer may include a black matrix and color filters. The color filters may be arranged in consideration of a color of light emitted by each of light-emitting diodes of the display element layer 20. In another embodiment, the anti-reflection layer may have a destructive interference structure. The destructive interference structure may include a first reflective layer and a second reflective layer that are located on different layers. First reflected light and second reflected light respectively reflected by the first reflective layer and the second reflective layer may be destructively interfered with each other, thereby reducing a reflectance of external light.

The optical functional layer 50 may include a lens layer. The lens layer may improve light extraction efficiency of light emitted by the display element layer 20 or may reduce color deviation. The lens layer may include a layer having a concave or convex lens shape, and/or may include a plurality of layers having different refractive indexes. The optical functional layer 50 may include both the anti-reflection layer and the lens layer, or may include any one of the anti-reflection layer and the lens layer.

The display panel 10 may have a first opening 10H1 and a second opening 10H2. In this regard, in FIG. 2, the display element layer 20, the input sensing layer 40, and the optical functional layer 50 respectively have first through third holes 20H, 40H, and 50H, and the first through third holes 20H, 40H, and 50H overlap one another.

The first hole 20H may pass through the display element layer 20 from a top surface to a bottom surface of the display element layer 20, the second hole 40H may pass through the input sensing layer 40 from a top surface to a bottom surface of the input sensing layer 40, and the third hole 50H may pass through the optical functional layer from a top surface to a bottom surface of the optical functional layer 50.

For example, the first through third holes 20H, 40H, and 50H may be located in the opening area OA to overlap one another. Sizes (or diameters) of the first through third holes 20H, 40H, and 50H may be the same or different from one another.

In another embodiment, at least one of the display element layer 20, the input sensing layer 40, and the optical functional layer 50 may not have an opening. For example, one or two elements among the display element layer 20, the input sensing layer 40, and the optical functional layer 50 may not have an opening.

The cover window 60 may be located on the optical functional layer 50. The cover window 60 may be coupled to the optical functional layer 50 through an adhesive layer such as an optical clear adhesive OCA located between the cover window 60 and the optical functional layer 50. The cover window 60 may include a glass material or a plastic material. Examples of the plastic material may include polyethersulfone, polyacrylate, polyetherimide, polyethylene naphthalate, polyethylene terephthalate, polyphenylene sulfide, polyarylate, polyimide, polycarbonate, or cellulose acetate propionate.

The cover window 60 may include a flexible window. For example, the cover window 60 may include a polyimide window or an ultra-thin glass window.

The opening area OA may be a component area (e.g., a sensor area, a camera area, a speaker area, etc.) in which the component 70 for performing various functions to the electronic device 1 is located. The component 70 may overlap a first hole 10H of the display panel 10. In an embodiment, a first component 71 may be located to correspond to the first opening area OA1, and a second component 72 may be located to correspond to the second opening area OA2. The first component 71 and the second component 72 may have the same function or may have different functions.

The component 70 may include an electronic element. For example, the component 70 may be an electronic element using light or sound. For example, the electronic element may include a sensor that uses light such as an infrared sensor, a camera that captures an image by receiving light, a sensor that measures a distance or recognizes a fingerprint by outputting and detecting light or sound, a small lamp that outputs light, or a speaker that outputs sound. When the component 70 is an electronic element using light, the component 70 may use light of various wavelength bands such as visible light, infrared light, or ultraviolet light. The opening area OA corresponds to a transmission area through which light and/or sound output from the component 70 to the outside or traveling from the outside toward the component 70 may be transmitted. In an embodiment, the first component 71 and the second component 72 may include electronic elements having the same function or different functions.

In another embodiment, when the electronic device 1 is used as a smart watch or a vehicle instrument panel, the component 70 may be a member including a clock hand or a needle indicating certain information (e.g., a vehicle speed). In this case, unlike in FIG. 1, the cover window 60 may have an opening that is located in the opening area OA and through which the component 70 such as a needle is exposed to the outside. Alternatively, even when the electronic device 1 includes the component 70 such as a speaker, the cover window 60 may have an opening corresponding to the opening area OA.

Figure 3:
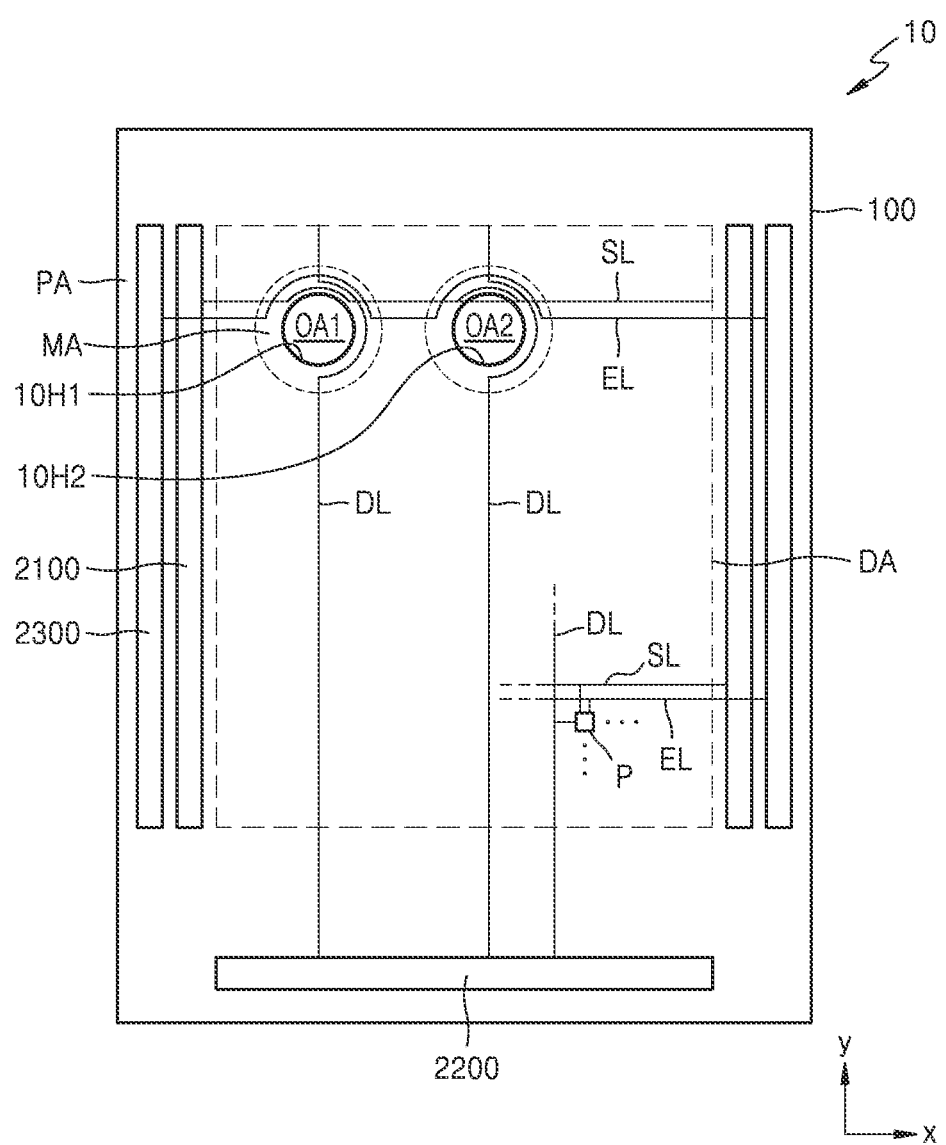
FIG. 3 is a plan view illustrating a display panel according to an embodiment.

FIG. 3 is a plan view illustrating a display panel, according to an embodiment.

Referring to FIG. 3, the display panel 10 may include the first opening area OA1, the second opening area OA2, the display area DA, the intermediate area MA, and the peripheral area PA. The display panel 10 may include a plurality of pixels P located in the display area DA, and may display an image by using light, for example, red, green, or blue light, emitted from a light-emitting diode of each pixel P.

Figure 5:
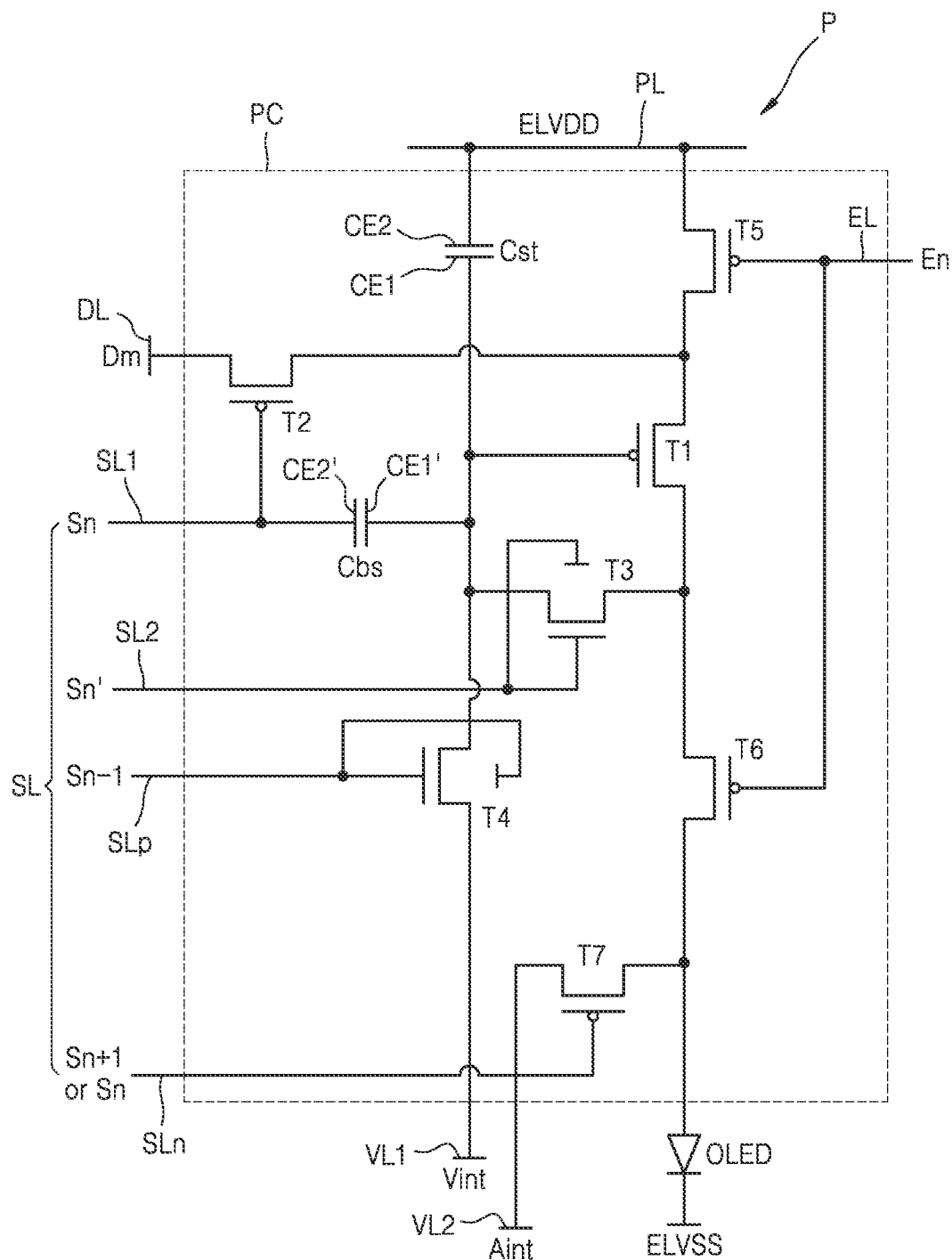
FIG. 5 is an equivalent circuit diagram illustrating a pixel included in a display apparatus according to an embodiment.

As shown in FIG. 5, the light-emitting diode of each pixel P may include an organic light-emitting diode OLED, and each organic light-emitting diode OLED may be electrically connected to a pixel circuit PC. Although the light-emitting diode includes the organic light-emitting diode OLED in FIG. 5, in another embodiment, the display panel 10 may include an inorganic light-emitting diode instead of the organic light-emitting diode OLED as described above.

Although the pixel circuit PC in FIG. 5 includes seven thin-film transistors, the disclosure is not limited thereto. The number of thin-film transistors and the number of storage capacitors may be changed in various ways according to a design of the pixel circuit PC.

Referring back to FIG. 3, the intermediate area MA may surround each of the first opening area OA1 and the second opening area OA2. The intermediate area MA is an area where a display element such as an organic light-emitting diode that emits light is not located, and signal lines for applying signals to the pixels P located around the first opening area OA1 and the second opening area OA2 may pass through the intermediate area MA. For example, data lines DL, emission control lines EL, and/or scan lines SL may horizontally cross the display area DA in the y direction and/or the x direction as shown in FIG. 3, and portions of the data lines DL, the emission control lines EL, and/or the scan lines SL may bypass the first hole 10H and may be disposed in the intermediate area MA along an edge of the first hole 10H of the display panel 10 formed in the opening area OA.

In the peripheral area PA, a scan driver 2100 for applying a scan signal to each pixel P, a data driver 2200 for applying a data signal to each pixel P, an emission control driver 2300 for applying an emission control signal to each pixel P, and a first main power supply wiring (not shown) and a second main power supply wiring (not shown) for respectively applying a first power supply voltage ELVDD (see FIG. 5) and a second power supply voltage ELVSS (see FIG. 5) may be located. Although the data driver 2200 is located adjacent to a side of a substrate 100 in FIG. 3, in another embodiment, the data driver 2200 may be located on a circuit board (e.g., a printed circuit board) electrically connected to a pad located on a side of the display panel 10. The circuit board may be flexible, and a part of the circuit board may be bent to be located under a bottom surface of the substrate 100.

The scan drivers 2100 and the emission control drivers 2300 may be located on both sides with the display area DA disposed therebetween. In another embodiment, at least one of the scan driver 2100 and the emission control driver 2300 may be located only on a side of the display area DA. The scan driver 2100 may be located closer to the display area DA than the emission control driver 2300 is.

Figure 4:
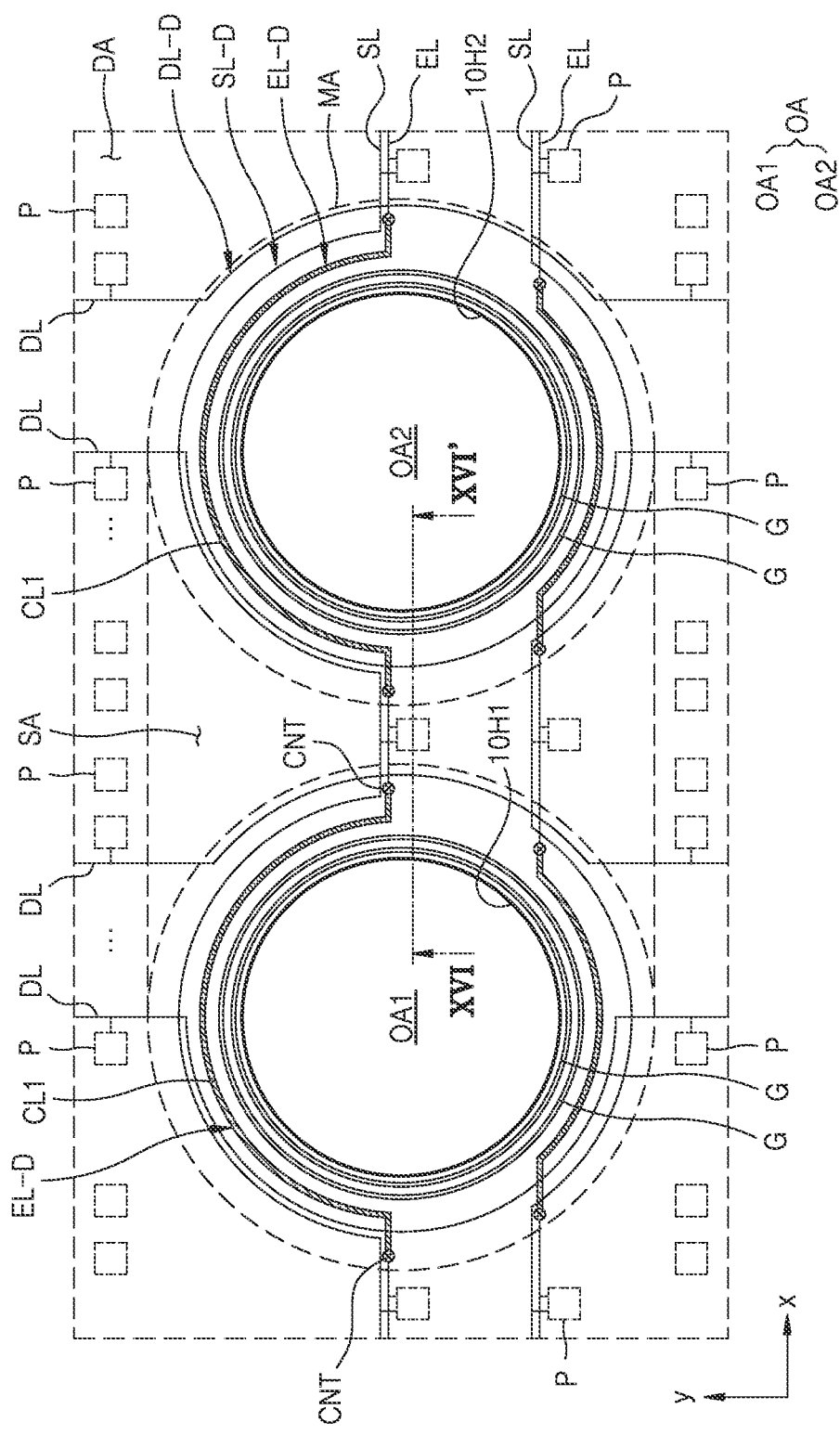
FIG. 4 is a plan view illustrating a part of a display panel according to an embodiment.

FIG. 4 is a plan view illustrating a part of a display panel, according to an embodiment.

Referring to FIG. 4, the pixels P may be located in the display area DA, and the intermediate area MA may be located between the opening area OA and the display area DA. The intermediate area MA may surround each of the first opening area OA1 and the second opening area OA2.

The pixels P disposed adjacent to the opening area OA may be spaced apart from one another with the opening area OA disposed between the pixels P in a plan view. As shown in FIG. 4, the pixels P may be vertically spaced apart from each other with the opening area OA disposed between the pixels P, or may be laterally spaced apart from each other with the opening area OA disposed between the pixels P. Because each pixel P uses red, green, or blue light emitted by a light-emitting diode as described above, positions of the pixels P illustrated in FIG. 4 respectively correspond to positions of light-emitting diodes. Accordingly, when the pixels P are spaced apart from one each other with the opening area OA disposed between the pixels P in a plan view, it may mean that light-emitting diodes are spaced apart from each other with the opening area OA disposed between the pixels P in a plan view. For example, in a plan view, the light-emitting diodes may be vertically spaced apart from each other with the opening area OA disposed between the pixels P, or may be laterally spaced apart from each other with the opening area OA disposed between the pixels P.

The pixels P may be located even in a separation area SA between the first opening area OA1 and the second opening area OA2. The separation area SA that is a portion of the display area DA may be defined as an area disposed between the intermediate areas MA respectively surrounding the first opening area OA1 and the second opening area OA2.

Signal lines adjacent to the first opening area OA1 and the second opening area OA2 from among signal lines for applying a signal to a pixel circuit connected to a light-emitting diode of each pixel P may bypass the first opening area OA1 and the second opening area OA2.

Some of the data lines DL passing through the display area DA may extend in the ±y direction (or second direction) to apply data signals to the pixels P vertically located with the opening area OA disposed therebetween, and may bypass the first opening area OA1 and the second opening area OA2 and may be disposed in the intermediate area MA along edges of the first opening area OA1 and the second opening area OA2. Some of the scan lines SL passing through the display area DA may extend in the ±x direction (or first direction) to apply scan signals to the pixels P laterally located with the first opening area OA1 and the second opening area OA2 disposed therebetween, and may bypass the first opening area OA1 and the second opening area OA2 and may be disposed in the intermediate area MA along the edges of the first opening area OA1 and the second opening area OA2.

Some of the emission control lines EL passing through the display area DA may extend in the ±x direction (or the first direction) to apply emission control signals to the pixels laterally located with the first opening area OA1 and the second opening area OA2 disposed therebetween, and may bypass the first opening area OA1 and the second opening area OA2 and may be disposed in the intermediate area MA along the edges of the first opening area OA1 and the second opening area OA2.

Bypassing portions of the signal lines bypassing the first opening area OA1 and the second opening area OA2 may be conductive layers located on different layers from the signal lines located in the display area DA. In an embodiment, regarding the emission control line EL, a bypassing portion EL-D of the emission control line EL located in the intermediate layer MA may be provided as a first conductive layer CL1 located on a different layer from the emission control line EL located in the display area DA. Accordingly, the emission control line EL located in the display area DA and the bypassing portion EL-D located in the intermediate area MA may be electrically connected to each other through a contact hole CNT formed in an insulating layer.

In the intermediate area MA, at least one groove may be located closer to the opening area OA than the bypassing portions of the signal lines. In this regard, FIG. 4 illustrates first and second grooves G. The first and second grooves G may have closed loop shapes surrounding the first opening area OA1 and the second opening area OA2, and may be spaced apart from each other. In another embodiment, in the intermediate area MA, at least one barrier wall (not shown) may be located closer to the opening area OA than the bypassing portions of the signal lines. The barrier walls may have closed loop shapes respectively surrounding the first opening area OA1 and the second opening area OA2, and may be spaced apart from each other. Because the barrier walls and/or the grooves G prevent penetration of moisture through the first opening 10H1 and the second opening 10H2, the barrier walls and the grooves G may exist together or only the barrier walls or the grooves G may exist according to needs.

FIG. 5 is an equivalent circuit diagram illustrating a pixel included in a display apparatus, according to an embodiment.

Referring to FIG. 5, one pixel P may include the pixel circuit PC and the organic light-emitting diode OLED.

For example, the pixel circuit PC may include first through seventh thin-film transistors (e.g., T1 through T7) and a storage capacitor Cst. The first through seventh thin-film transistors (e.g., T1 through T7) and the storage capacitor Cst may be connected to signal lines (e.g., SL1, SL2, SLp, SLn, EL, and DL), a first initialization voltage line VL1, a second initialization voltage line VL2 (or an anode initialization voltage line), and a driving voltage line PL. In an embodiment, at least one of the wirings, for example, the driving voltage line PL, may be shared by neighboring pixels P.

The first through seventh thin-film transistors (e.g., T1 through T7) may include a driving thin-film transistor T1, a switching thin-film transistor T2, a compensation thin-film transistor T3, a first initialization thin-film transistor T4, an operation control thin-film transistor T5, an emission control thin-film transistor T6, and a second initialization thin-film transistor T7.

The organic light-emitting diode OLED may include a first electrode (e.g., an anode) and a second electrode (e.g., a cathode), and a first terminal of the organic light-emitting diode OLED may be connected to the driving thin-film transistor T1 via the emission control thin-film transistor T6 to receive driving current, and a second terminal of the organic light-emitting diode OLED may receive a low power supply voltage ELVSS. The organic light-emitting diode OLED may generate light having a luminance corresponding to the driving current.

Some of the first through seventh thin-film transistors (e.g., T1 through T7) may be provided as n-channel MOSFETs (NMOSs) and the rest may be provided as p-channel MOSFETs (PMOSs). For example, the compensation thin-film transistor T3 and the first initialization thin-film transistor T4 from among the first through seventh thin-film transistors (e.g., T1 through T7) may be provided as NMOSs and the rest may be provided as PMOSs.

In another embodiment, the compensation thin-film transistor T3, the first initialization thin-film transistor T4, and the second initialization thin-film transistor T7 from among the first through seventh thin-film transistors (e.g., T1 through T7) may be provided as NMOSs and the rest may be provided as PMOSs. Alternatively, only one of the first through seventh thin-film transistors (e.g., T1 through T7) may be provided as an NMOS and the rest may be provided as PMOS s. Alternatively, all of the first through seventh thin-film transistors (e.g., T1 through T7) may be provided as NMOS s.

Signal lines may include a first scan line SL1 that transmits a first scan signal Sn, a second scan line SL2 that transmits a second scan signal Sn', a previous scan line SLp that transmits a previous scan signal Sn−1 to the first initialization thin-film transistor T4, the emission control line EL that transmits an emission control signal En to the operation control thin-film transistor T5 and the emission control thin-film transistor T6, a next scan line SLn that transmits a next scan signal Sn+1 to the second initialization thin-film transistor T7, and the data line DL that intersects the first scan line SL1 and transmits a data signal Dm.

The driving voltage line PL may transmit a driving voltage ELVDD to the driving thin-film transistor T1. The first initialization voltage line VL1 may transmit an initialization voltage Vint for initializing the driving thin-film transistor T1. The second initialization voltage line VL2 may transmit an anode initialization voltage Aint for initializing a pixel electrode.

A driving gate electrode of the driving thin-film transistor T1 may be connected to the storage capacitor Cst, a source region of the driving thin-film transistor T1 may be connected to the driving voltage line PL via the operation control thin-film transistor T5, and a drain region of the driving thin-film transistor T1 may be electrically connected to the pixel electrode of the organic light-emitting diode OLED via the emission control thin-film transistor T6. The driving thin-film transistor T1 may receive the data signal Dm according to a switching operation of the switching thin-film transistor T2 and may supply driving current $I_{OLED}$ to the organic light-emitting diode OLED.

A switching gate electrode of the switching thin-film transistor T2 may be connected to the first scan line SL1 that transmits the first scan signal Sn, a source region of the switching thin-film transistor T2 may be connected to the data line DL, and a drain region of the switching thin-film transistor T2 may be connected to the source region of the driving thin-film transistor T1 and may be connected to the driving voltage line PL via the operation control thin-film transistor T5. The switching thin-film transistor T2 may be turned on in response to the first scan signal Sn received through the first scan line SL1, and may perform a switching operation of transmitting the data signal transmitted through the data line DL to the source region of the driving thin-film transistor T1.

A gate electrode of the compensation thin-film transistor T3 may be connected to the second scan line SL2. A drain region of the compensation thin-film transistor T3 may be connected to the drain region of the driving thin-film transistor T1, and may be connected to the pixel electrode of the organic light-emitting diode OLED via the emission control thin-film transistor T6. A source region of the compensation thin-film transistor T3 may be connected to a first electrode CE1 of the storage capacitor Cst and the driving gate electrode of the driving thin-film transistor T1. Also, the source region may be connected to a drain region of the first initialization thin-film transistor T4.

The compensation thin-film transistor T3 may be turned on in response to the second scan signal Sn' received through the second scan line SL2, and may diode-connect the driving thin-film transistor T1 by electrically connecting the gate electrode and the drain region of the driving thin-film transistor T1.

A gate electrode of the first initialization thin-film transistor T4 may be connected to the previous scan line SLp. A source region of the first initialization thin-film transistor T4 may be connected to the first initialization voltage line VL1. The drain region of the first initialization thin-film transistor T4 may be connected to the first electrode CE1 of the storage capacitor Cst, the source region of the compensation thin-film transistor T3, and the gate electrode of the driving thin-film transistor T1. The first initialization thin-film transistor T4 may be turned on in response to the previous scan signal Sn−1 received through the previous scan line SLp, and may perform an initialization operation of initializing a voltage of the gate electrode of the driving thin-film transistor T1 by transmitting the initialization voltage Vint to the gate electrode of the driving thin-film transistor T1.

A gate electrode of the operation control thin-film transistor T5 may be connected to the emission control line EL, a source region of the operation control thin-film transistor T5 may be connected to the driving voltage line PL, and a drain region of the operation control thin-film transistor T5 may be connected to the source region of the driving thin-film transistor T1 and the drain region of the switching thin-film transistor T2.

A gate electrode of the emission control thin-film transistor T6 may be connected to the emission control line EL, a source region of the emission control thin-film transistor T6 may be connected to the drain region of the driving thin-film transistor T1 and the drain region of the compensation thin-film transistor T3, and a drain region of the emission control thin-film transistor T6 may be electrically connected to a drain region of the second initialization thin-film transistor T7 and the pixel electrode of the organic light-emitting diode OLED.

The operation control thin-film transistor T5 and the emission control thin-film transistor T6 may be simultaneously turned on in response to the emission control signal En received through the emission control line EL, and thus the driving voltage ELVDD is transmitted to the organic light-emitting diode OLED and the driving current $I_{OLED}$ flows through the organic light-emitting diode OLED.

A gate electrode of the second initialization thin-film transistor T7 may be connected to the next scan line SLn, the drain region of the second initialization thin-film transistor T7 may be connected to the drain region of the emission control thin-film transistor T6 and the pixel electrode of the organic light-emitting diode OLED, and the source region of the second initialization thin-film transistor T7 may be connected to the second initialization voltage line VL2 to receive an anode initialization voltage Aint. The second initialization thin-film transistor T7 is turned on in response to the next scan signal Sn+1 received through the next scan line SLn, to initialize the pixel electrode of the organic light-emitting diode OLED. In another embodiment, the second initialization thin-film transistor T7 is turned on in response to the scan signal Sn received through the scan line SL1 to initialize the pixel electrode of the organic light-emitting diode OLED.

The second initialization thin-film transistor T7 may be connected to the next scan line SLn as shown in FIG. 2. In another embodiment, the second initialization thin-film transistor T7 may be connected to the emission control line EL and may be driven according to the emission control signal En. Positions of a source region and a drain region may vary according to a type of a transistor (e.g., a p type or an n type).

The storage capacitor Cst may include the first electrode CE1 and a second electrode CE2. The first electrode CE1 of the storage capacitor Cst is connected to the gate electrode of the driving thin-film transistor T1, and the second electrode CE2 of the storage capacitor Cst is connected to the driving voltage line PL. The storage capacitor Cst may store a charge corresponding to a difference between a gate electrode voltage of the driving thin-film transistor T1 and the driving voltage ELVDD.

A boosting capacitor Cbs may include a first electrode CE1' and a second electrode CE2'. The first electrode CE1' of the boosting capacitor Cbs may be connected to the first electrode CE1 of the storage capacitor Cst, and the second electrode CE2' of the boosting capacitor Cbs may receive the first scan signal Sn. The boosting capacitor Cbs may compensate for voltage drop of a gate terminal of the driving thin-film transistor T1 by increasing a voltage of the gate terminal of the driving thin-film transistor T1 at a point when the transmission of the first scan signal Sn is stopped.

A specific operation of each pixel P according to an embodiment is as follows.

During an initialization period, when the previous scan signal Sn−1 is applied through the previous scan line SLp, the first initialization thin-film transistor T4 is turned on in response to the previous scan signal Sn−1, and the gate electrode of the driving thin-film transistor T1 is initialized by the initialization voltage Vint supplied from the first initialization voltage line VL1.

During a data programming period, when the first scan signal Sn and the second scan signal Sn' are applied through the first scan line SL1 and the second scan line SL2, the switching thin-film transistor T2 and the compensation thin-film transistor T3 are turned on in response to the first scan signal Sn and the second scan signal Sn'. In this case, the driving thin-film transistor T1 is diode-connected by the turned-on compensation thin-film transistor T3 and is forward biased.

Next, a compensation voltage Dm−|Vth| obtained by subtracting a threshold voltage Vth of the driving thin-film transistor T1 from the data signal Dm applied from the data line DL is applied to the gate electrode of the driving thin-film transistor T1.

The driving voltage ELVDD and the compensation voltage Dm−|Vth| are applied to both nodes of the storage capacitor Cst, and a charge corresponding to a voltage difference between both nodes is stored in the storage capacitor Cst.

During an emission period, the operation control thin-film transistor T5 and the emission control thin-film transistor T6 are turned on by the emission control signal En applied from the emission control line EL. The driving current $I_{OLED}$ is generated according to a voltage difference between a voltage of the gate electrode of the driving thin-film transistor T1 and the driving voltage ELVDD, and is supplied through the emission control thin-film transistor T6 to the organic light-emitting diode OLED.

In the present embodiment, at least one of the first through seventh thin-film transistors (e.g., T1 through T7) includes a semiconductor layer including an oxide, and the reset include a semiconductor layer including silicon.

In detail, the driving thin-film transistor T1 that directly affects the brightness of a display apparatus may be configured to include a semiconductor layer formed of polycrystalline silicon having high reliability, thereby realizing a high-resolution display apparatus.

Because an oxide semiconductor has high carrier mobility and small leakage current, voltage drop is not large even when a driving time is long. That is, because a color change in an image due to voltage drop is not large even during low frequency driving, low frequency driving is possible.

As such, because an oxide semiconductor has small leakage current, when at least one of the compensation thin-film transistor T3 and the first initialization thin-film transistor T4 connected to the gate electrode of the driving thin-film transistor T1 includes an oxide semiconductor, leakage current that may flow to the gate electrode may be prevented and power consumption may be reduced.

Figure 6:
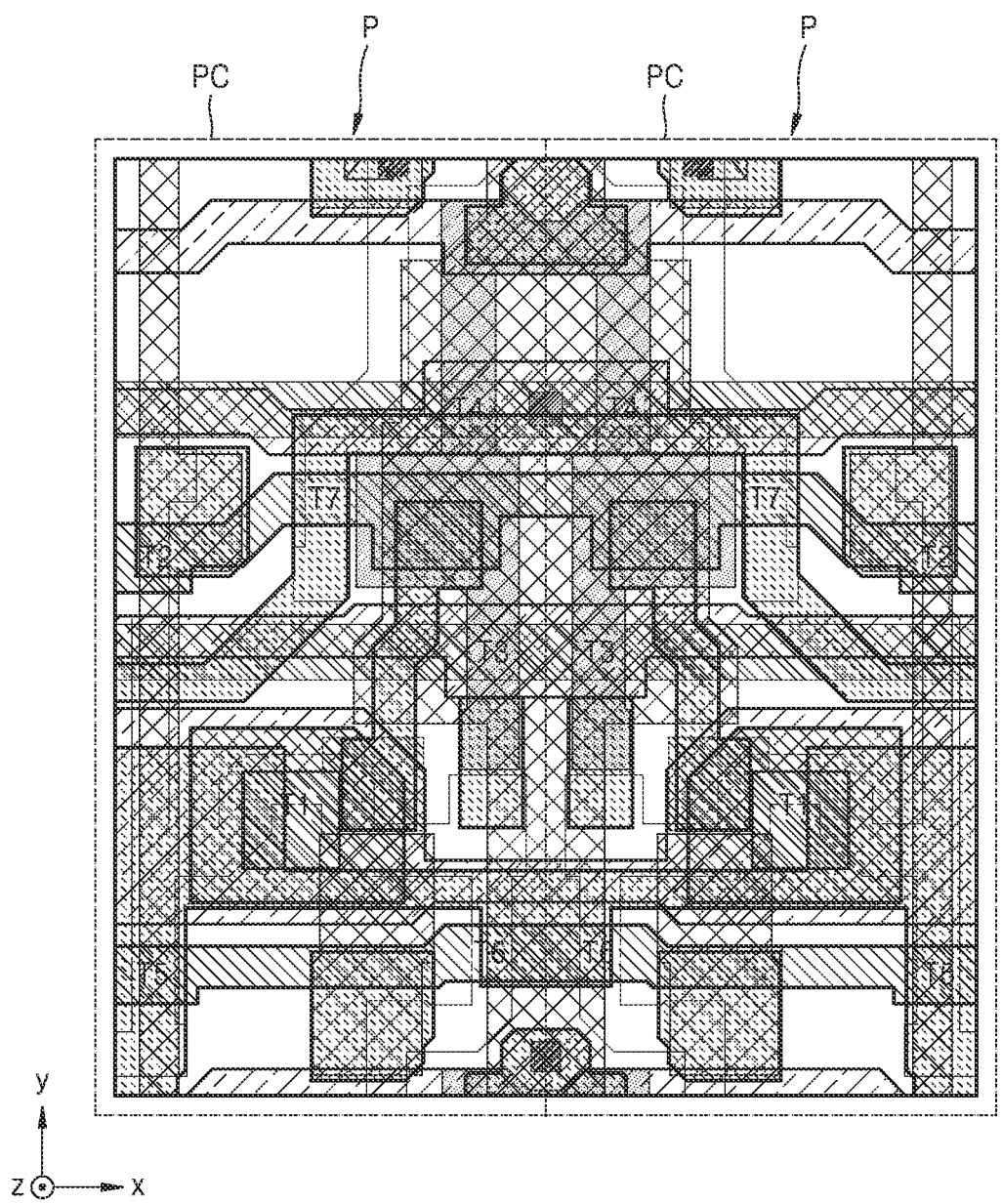
FIG. 6 is a plan view illustrating a structure of a pixel circuit according to an embodiment.

FIG. 6 is a plan view illustrating a structure of a pixel circuit according to an embodiment. FIGS. 7A through 7G are plan views illustrating conductive patterns constituting the pixel circuit of FIG. 6 according to layers. FIG. 8 is a cross-sectional view illustrating a part of a structure of a pixel circuit according to an embodiment.

Figure 7A:
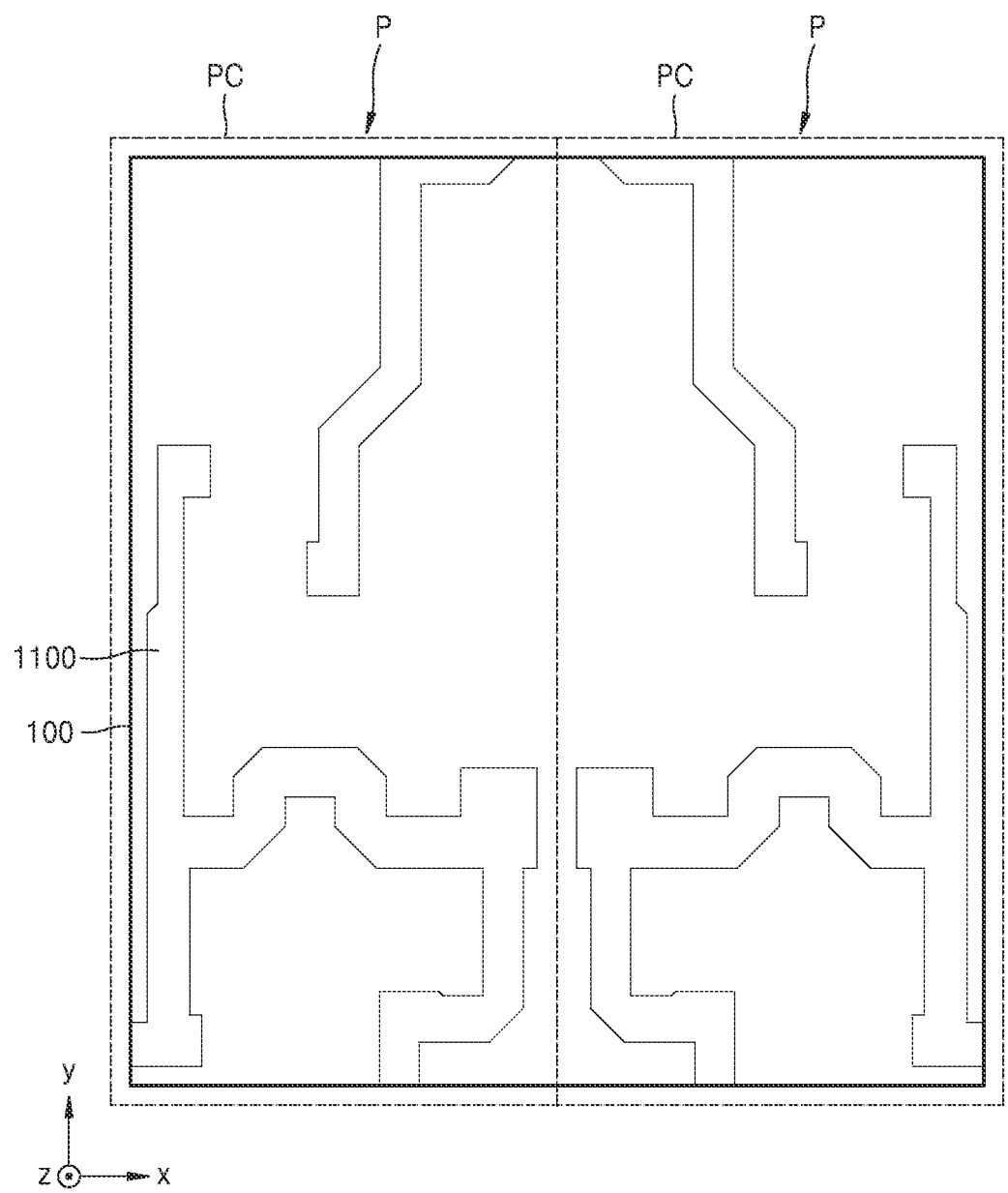
FIGS. 7A, 7B, 7C, 7D, 7E, 7F and 7G are plan views illustrating conductive patterns constituting the pixel circuit of FIG. 6 as layers.
Figure 8:
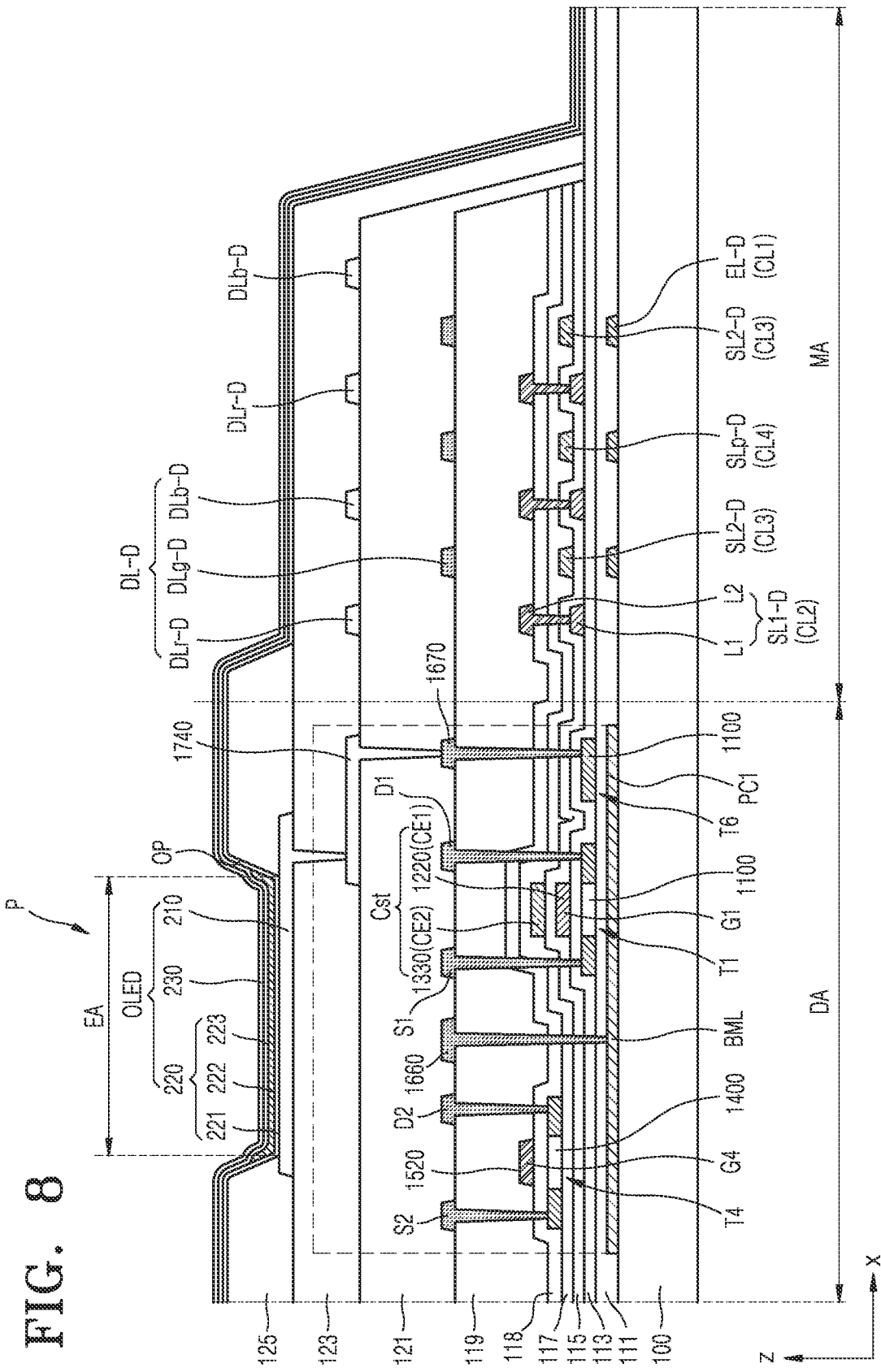
FIG. 8 is a cross-sectional view illustrating a part of a structure of a pixel circuit according to an embodiment.

Referring to FIG. 7A with FIGS. 6 and 8, the electronic device 1 may include adjacent pixels P. In an embodiment, as shown in FIGS. 6 and 7A, two pixels P may form a pair to be symmetric with respect to an imaginary line. In another embodiment, the pixels P have a structure in which the same pixel structure, instead of a symmetric structure, is continuously repeated. Each of the pixels P may include the pixel circuit PC.

For convenience of explanation, some conductive patterns will be described based on one pixel circuit PC.

The substrate 100 may include glass, quartz, plastic, or the like. In an embodiment, the substrate 100 may include plastic, and thus the electronic device 1 may be flexible. In this case, the substrate 100 may have a structure in which at least one organic film layer and at least one barrier layer are alternately stacked. For example, the organic film layer may be formed of an organic material such as polyimide, and the barrier layer may be formed of an inorganic material.

A buffer layer 111 (see FIG. 8) may be located on the substrate 100. The buffer layer 111 may prevent metal atoms or impurities from being diffused from the substrate 100 to a first active pattern 1100. Also, the buffer layer 111 may adjust a heat supply rate during a crystallization process for forming the first active pattern 1100, to uniformly form the first active pattern 1100.

The first active pattern 1100 may be located on the buffer layer 111. In an embodiment, the first active pattern 1100 may include a silicon semiconductor. Examples of the silicon semiconductor may include amorphous silicon and polycrystalline silicon. For example, the first active pattern 1100 may include a low-temperature polysilicon (LTPS).

In an embodiment, ions may be implanted into the first active pattern 1100. For example, when the driving thin-film transistor T1, the switching thin-film transistor T2, the operation control thin-film transistor T5, the emission control thin-film transistor T6, and the second initialization thin-film transistor T7 are PMOSs, ions such as boron ions may be implanted into the first active pattern 1100.

A first gate insulating layer 113 (see FIG. 8) may cover the first active pattern 1100 and may be located on the substrate 100. The first gate insulating layer 113 may include an insulating material. For example, the first gate insulating layer 113 may include silicon oxide, silicon nitride, silicon oxynitride, or aluminum oxide.

Figure 7B:
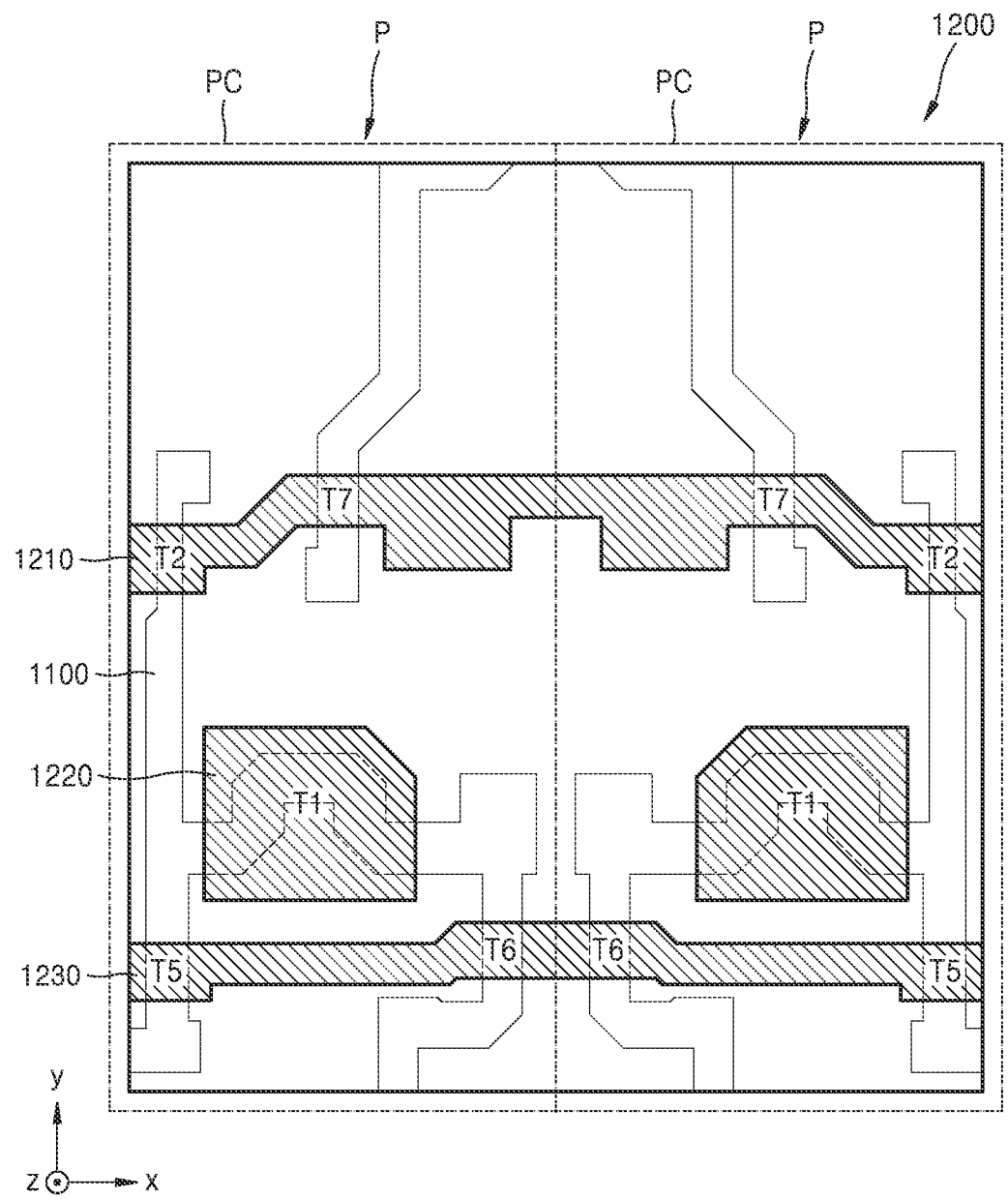

Referring to FIG. 7B with FIGS. 6 and 8, a first conductive pattern 1200 may be located on the first gate insulating layer 113. The first conductive pattern 1200 may include a first gate wiring 1210, a first gate electrode 1220, and a second gate wiring 1230.

The first gate wiring 1210 may extend in the first direction (e.g., the x direction). The first gate wiring 1210 may correspond to the first scan line SL1 of FIG. 5. The first gate wiring 1210 may constitute the switching thin-film transistor T2 with the first active pattern 1100. For example, the first scan signal Sn may be applied to the first gate wiring 1210. Also, the first gate wiring 1210 may constitute the second initialization thin-film transistor T7 with the first active pattern 1100. For example, the first scan signal Sn may be applied to the first gate wiring 1210.

The first gate electrode 1220 may have an isolated island shape. The first gate electrode 1220 may constitute the driving thin-film transistor T1 with the first active pattern 1100.

The second gate wiring 1230 may extend in the first direction (e.g., the x direction). The second gate wiring 1230 may correspond to the emission control line EL of FIG. 5. The second gate wiring 1230 may constitute the operation control thin-film transistor T5 and the emission control thin-film transistor T6 with the first active pattern 1100. For example, the emission control signal En may be applied to the second gate wiring 1230.

The first conductive pattern 1200 may include a metal, an alloy, a conductive metal oxide, or a transparent conductive material. For example, the first conductive pattern 1200 may include silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), or indium zinc oxide (IZO).

A first interlayer insulating layer 115 (see FIG. 8) may cover the first conductive pattern 1200 and may be located on the first gate insulating layer 113. The first interlayer insulating layer 115 may include an insulating material, like the first gate insulating layer 113.

Figure 7C:
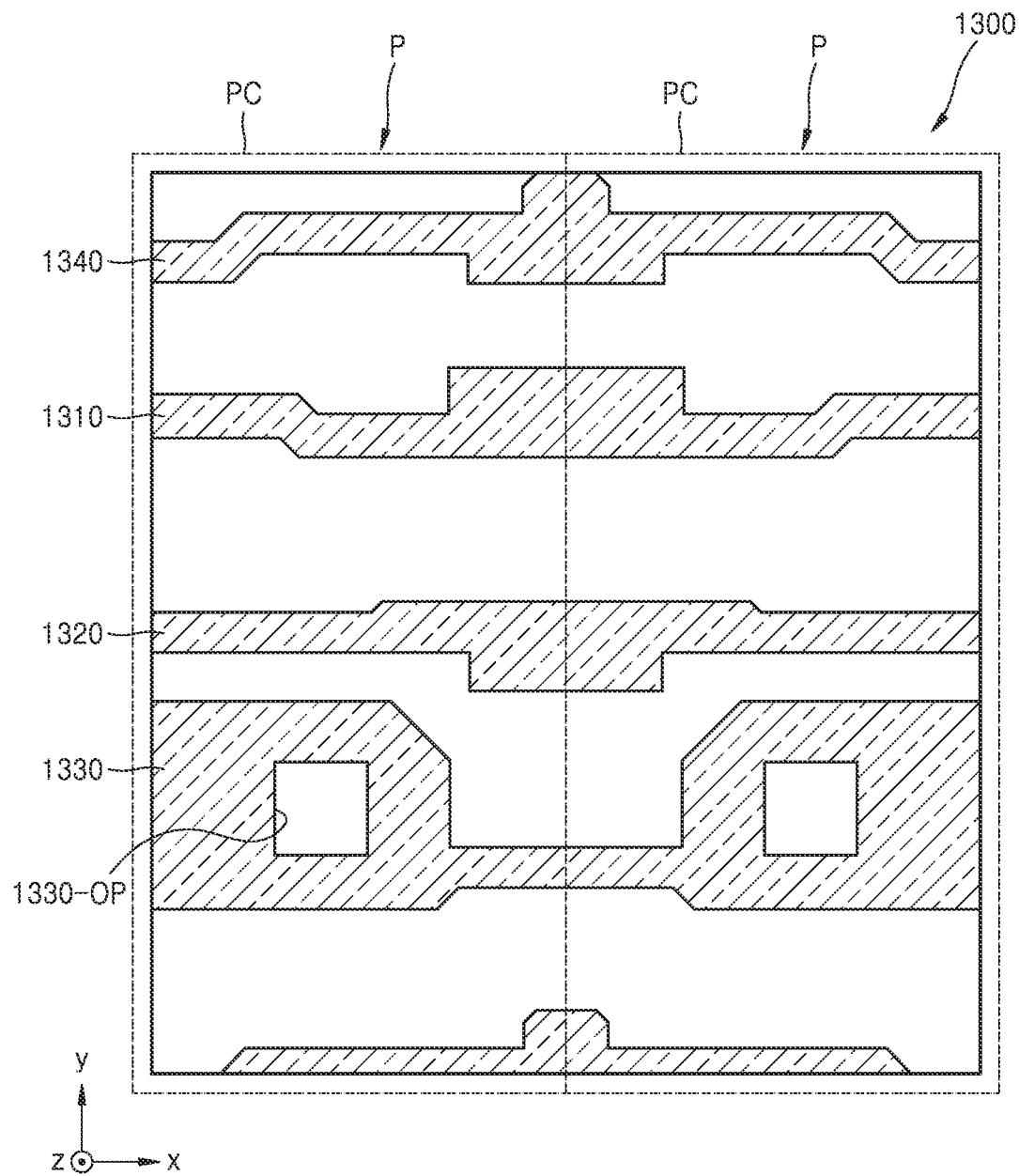

Referring to FIG. 7C with FIGS. 6 and 8, a second conductive pattern 1300 may be located on the first interlayer insulating layer 115. The second conductive pattern 1300 may include a third gate wiring 1310, a fourth gate wiring 1320, a storage capacitor electrode 1330 (i.e., the second electrode CE2 of FIG. 5), and a first initialization voltage line 1340 (i.e., the first initialization voltage line VL1 of FIG. 5).

The third gate wiring 1310 may extend in the first direction (e.g., the x direction). The third gate wiring 1310 may correspond to the previous scan line SLp of FIG. 5. The third gate wiring 1310 may be spaced apart from the first gate wiring 1210 in a plan view. The previous scan signal Sn−1 may be applied to the third gate wiring 1310.

The fourth gate wiring 1320 may extend in the first direction (e.g., the x direction). The fourth gate wiring 1320 may correspond to the second scan line SL2 of FIG. 5. The fourth gate wiring 1320 may be spaced apart from the first gate wiring 1210 and the third gate wiring 1310 in a plan view. The second scan signal Sn' may be applied to the fourth gate wiring 1320.

The storage capacitor electrode 1330 may overlap the first gate electrode 1220, and may extend in the first direction (e.g., the x direction). For example, the storage capacitor electrode 1330 may constitute the storage capacitor Cst with the first gate electrode 1220. The driving voltage ELVDD may be applied to the storage capacitor electrode 1330. A hole passing through the storage capacitor electrode 1330 may be formed in the storage capacitor electrode 1330 and the first gate electrode 1220 may be exposed through the hole.

The first initialization voltage line 1340 may extend in the first direction (e.g., the x direction). The first initialization voltage line 1340 may be spaced apart from the third gate wiring 1310 in a plan view. The first initialization voltage Vint may be applied through the first initialization voltage line 1340. The first initialization voltage line 1340 may at least partially overlap a second active pattern 1400 described below and may transmit the first initialization voltage Vint to the second active pattern 1400. The first initialization voltage line 1340 may be electrically connected to the second active pattern 1400 through contact portions 1680CNT1, 1680CNT2, and 1680CNT3 of FIG. 7F described below. The first initialization voltage line 1340 may be the first initialization voltage line VL1 of FIG. 5.

The second conductive pattern 1300 may include, for example, a metal, an alloy, a conductive metal oxide, or a transparent conductive material, like the first conductive pattern 1200. The second conductive pattern 1300 may include, for example, molybdenum (Mo) or an alloy containing molybdenum.

A second interlayer insulating layer 117 (see FIG. 8) may cover the second conductive pattern 1300, and may be located on the first interlayer insulating layer 115. The second interlayer insulating layer 117 may include an insulating material. For example, the second interlayer insulating layer 117 may include silicon oxide, silicon nitride, silicon oxynitride, or aluminum oxide.

Figure 7D:
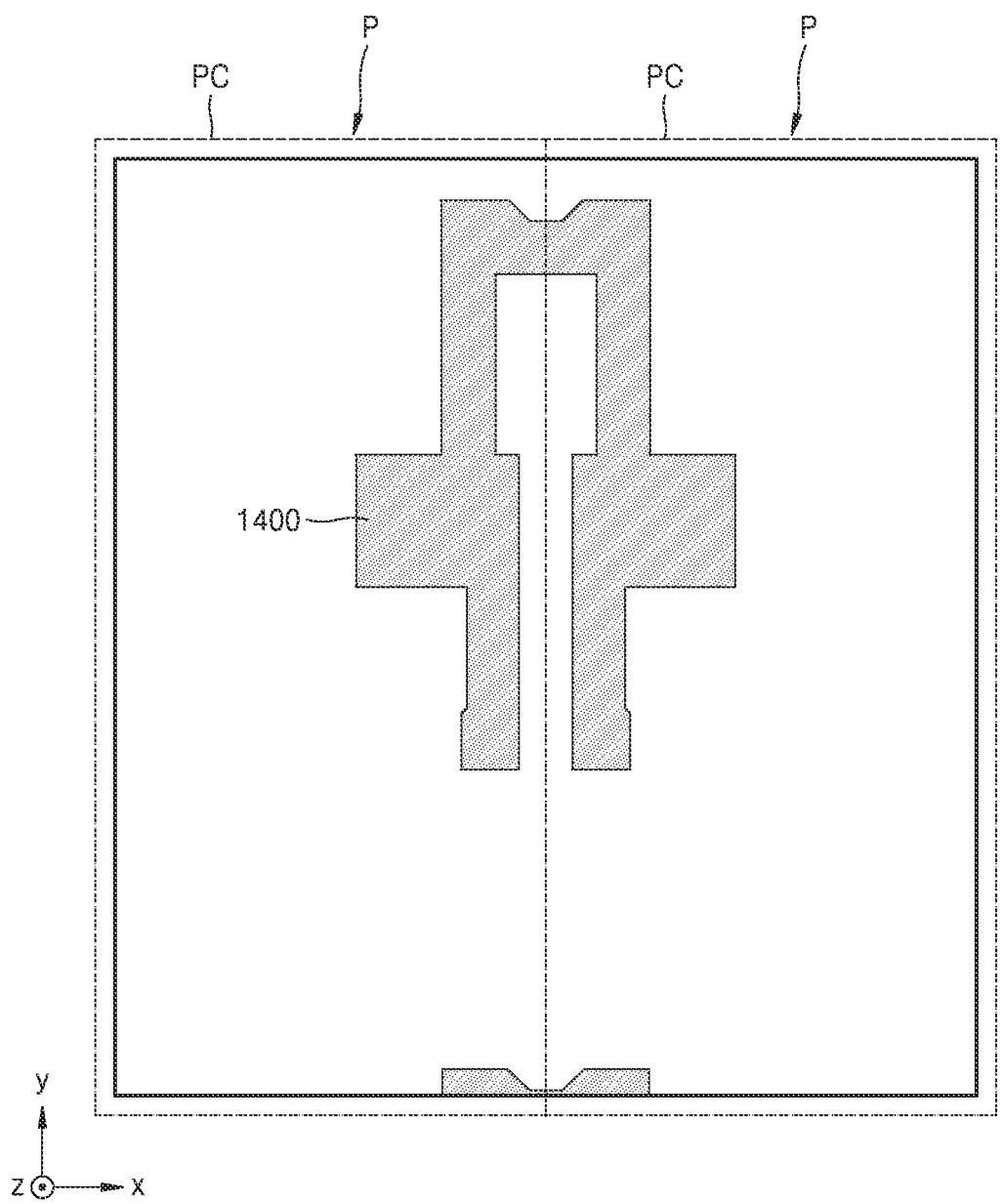

Referring to FIG. 7D with FIGS. 6 and 8, the second active pattern 1400 may be located on the second interlayer insulating layer 117. In the present embodiment, the second active pattern 1400 may include an oxide semiconductor. The second active pattern 1400 may be located on a different layer from the first active pattern 1100 and may not overlap the first active pattern 1100.

A second gate insulating layer 118 may cover the second active pattern 1400, and may be located on the second interlayer insulating layer 117. The second gate insulating layer 118 may include an insulating material.

In another embodiment, the second gate insulating layer 118 may be patterned to cover a part of the second active pattern 1400 and expose the remaining portion. In this case, the second gate insulating layer 118 may be formed in the same pattern as that of a second gate wiring 1520 of FIG. 8. Accordingly, a source region and a drain region in the second active pattern 1400 may be exposed and a channel region may be covered by the second gate insulating layer 118 which overlaps the second gate wiring 1520 in a plan view. The source region and the drain region may directly contact a third interlayer insulating layer 119 as shown in FIG. 8.

Figure 7E:
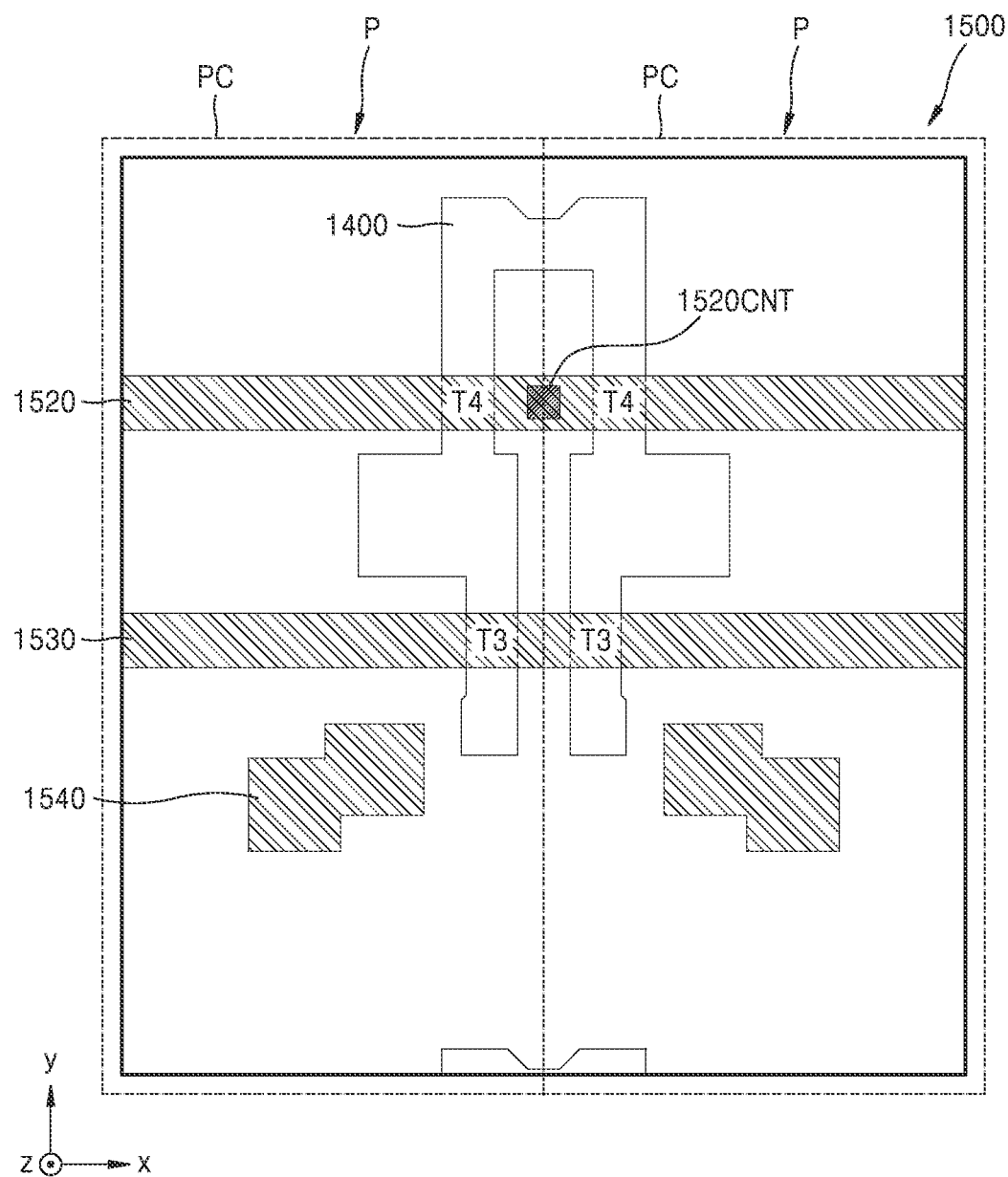

Referring to FIG. 7E with FIGS. 6 and 8, a third conductive pattern 1500 may be located on the second gate insulating layer 118. The third conductive pattern 1500 may include the second gate wiring 1520, a fifth gate wiring 1530, and a first transfer pattern 1540.

The second gate wiring 1520 may overlap the third gate wiring 1310 and the second active pattern 1400. In the present embodiment, the second gate wiring 1520 may be electrically connected to the third gate wiring 1310. For example, the second gate wiring 1520 may contact the third gate wiring 1310 through a contact portion 1520CNT. The contact portion 1520CNT may be formed through a contact hole passing through insulating layers (e.g., the second interlayer insulating layer 117 and the third interlayer insulating layer 118) located between the third gate wiring 1310 and the second gate wiring 1520.

The previous scan signal Sn−1 may be applied to the second gate wiring 1520. The third gate wiring 1310, the second active pattern 1400, and the second gate wiring 1520 may constitute the first initialization thin-film transistor T4. For example, the third gate wiring 1310 may correspond to a back-gate electrode of the first initialization thin-film transistor T4 and the second gate wiring 1520 may correspond to the gate electrode of the first initialization thin-film transistor T4.

The fifth gate wiring 1530 may extend in the first direction (e.g., the x direction). The fifth gate wiring 1530 may overlap the fourth gate wiring 1320 and the second active pattern 1400. In some embodiments, the fifth gate wiring 1530 may be electrically connected to the fourth gate wiring 1320. For example, the fifth gate wiring 1530 may contact the fourth gate wiring 1320 through a contact portion (not shown).

The second scan signal Sn' may be applied to the fifth gate wiring 1530. The fourth gate wiring 1320, the second active pattern 1400, and the fifth gate wiring 1530 may constitute the compensation thin-film transistor T3. For example, the fourth gate wiring 1320 may correspond to a back-gate electrode of the compensation thin-film transistor T3 and the fifth gate wiring 1530 may correspond to the gate electrode of the compensation thin-film transistor T3.

The first transfer pattern 1540 may contact the first gate electrode 1220 exposed through an opening 1330-OP of the storage capacitor electrode 1330. The first transfer pattern 1540 may transmit the initialization voltage Vint to the first gate electrode 1220.

The third conductive pattern 1500 may include, for example, a metal, an alloy, a conductive metal oxide, or a transparent conductive material, like the first conductive pattern 1200. The third conductive pattern 1500 may include, for example, molybdenum (Mo) or an alloy containing molybdenum.

Figure 12:
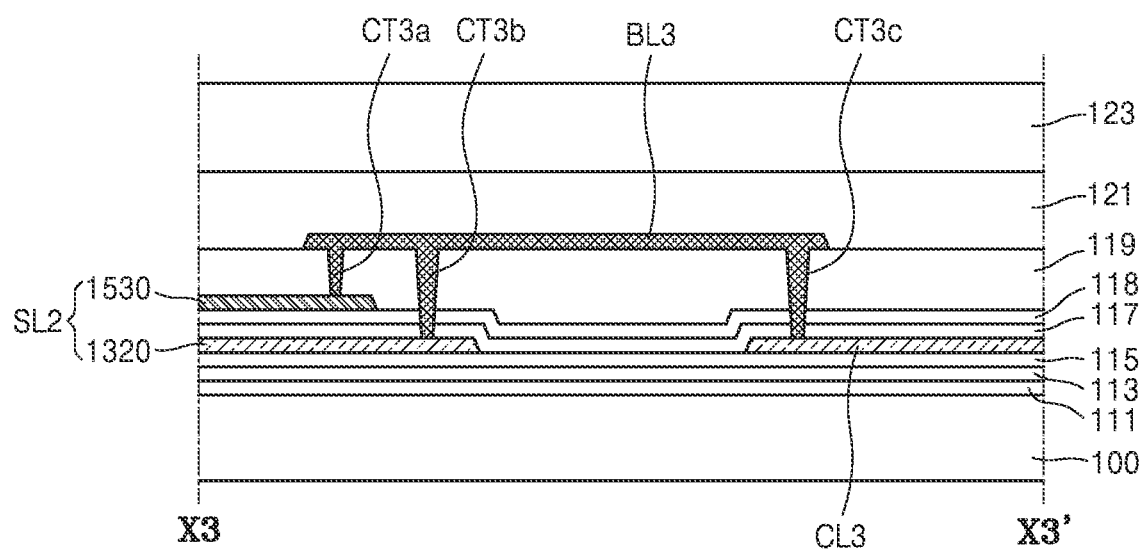
FIG. 12 is a cross-sectional view taken along line X3-X3' of FIG. 9.

The third interlayer insulating layer 119 may cover at least a part of the third conductive pattern 1500 (1520, 1530 and 1540) of FIGS. 7E, 8 and 12. The third interlayer insulating layer 119 may include an insulating material. For example, the third interlayer insulating layer 119 may include silicon oxide, silicon nitride, silicon oxynitride, or aluminum oxide.

Figure 7F:
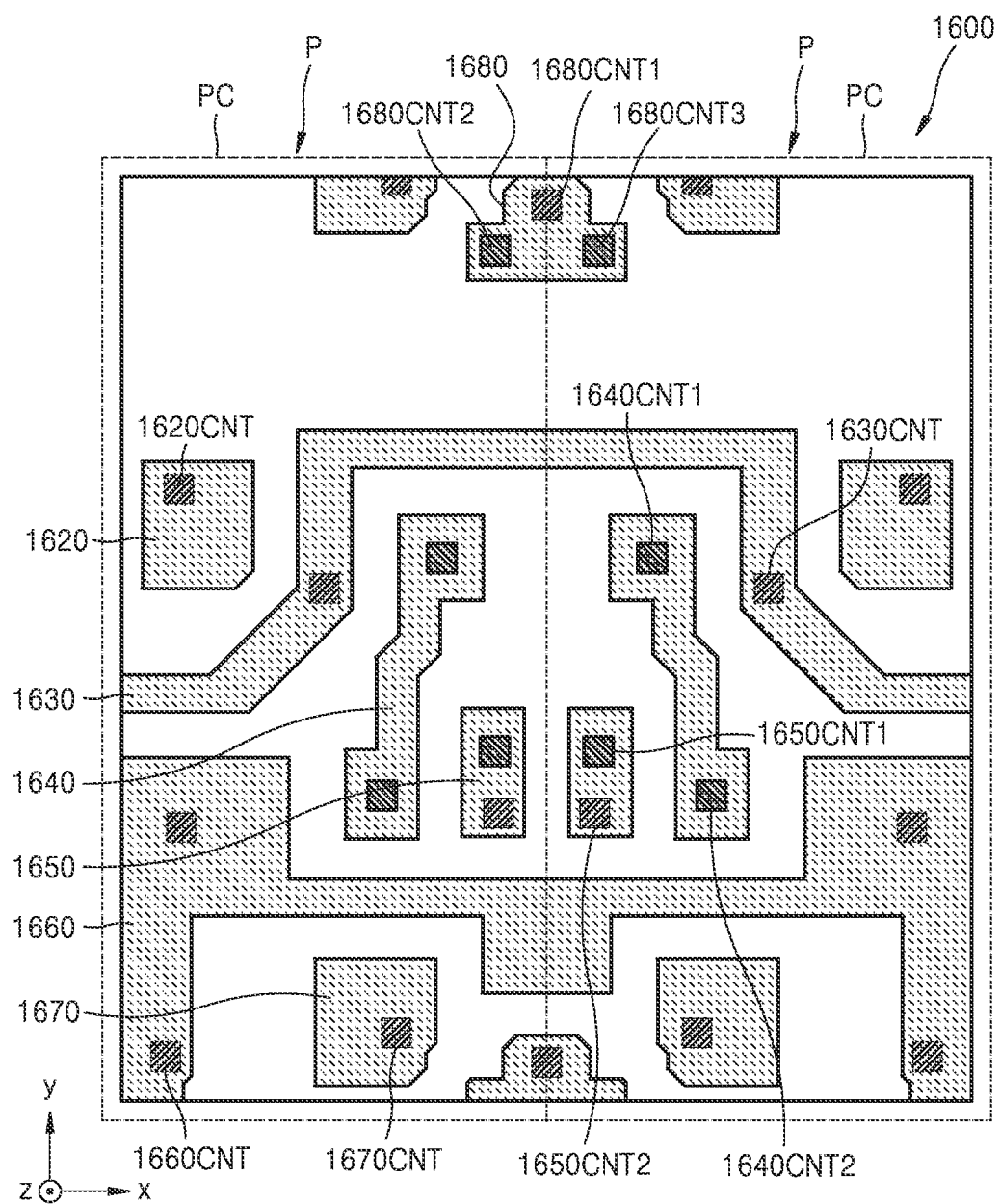

Referring to FIG. 7F with FIGS. 6 and 8, a fourth conductive pattern 1600 may be located on the third interlayer insulating layer 119. The fourth conductive pattern 1600 may include a second transfer pattern 1620, a second initialization voltage line 1630, a third transfer pattern 1640, a fourth transfer pattern 1650, a fifth transfer pattern 1660, and a sixth transfer pattern 1670.

The second transfer pattern 1620 may contact the first active pattern 1100 through a contact portion 1620CNT. The data signal Dm may be transmitted to the first active pattern 1100 through the second transfer pattern 1620.

The second initialization voltage line 1630 (i.e., the second initialization voltage line VL2 of FIG. 5) may extend in the first direction (e.g., the x direction). The second initialization voltage Aint may be applied to the second initialization voltage line 1630. The second initialization voltage line 1630 may contact the first active pattern 1100 through a contact portion 1630CNT, and may transmit the second initialization voltage Aint to the first active pattern 1100.

The third transfer pattern 1640 may contact the second active pattern 1400 and the first transfer pattern 1540 through contact portions 1640CNT1 and 1640CNT2 respectively formed on one side and the other side of the third transfer pattern 1640. The first initialization voltage Vint may be transmitted to the first gate electrode 1220 through the second active pattern 1400, the third transfer pattern 1640, and the first transfer pattern 1540.

The fourth transfer pattern 1650 may contact the second active pattern 1400 and the first active pattern 1100 through contact portions 1650CNT1 and 1650CNT2 respectively formed in one side and the other side of the fourth transfer pattern 1650. The fourth transfer pattern 1650 may electrically connect the second active pattern 1400 and the first active pattern 1100.

The fifth transfer pattern 1660 may extend in the first direction (e.g., the x direction). The driving voltage ELVDD may be applied to the fifth transfer pattern 1660. The fifth transfer pattern 1660 may contact the first active pattern 1100 through a contact portion 1660CNT and may transmit the driving voltage ELVDD to the first active pattern 1100.

The sixth transfer pattern 1670 may contact the first active pattern 1100 through a contact portion 1670CNT. The sixth transfer pattern 1670 may transmit driving current or the second initialization voltage Aint from the first active pattern 1100 to the organic light-emitting diode OLED.

A seventh transfer pattern 1680 may contact the second active pattern 1400 through the contact portions 1680CNT1, 1680CNT2, and 1680CNT3. The seventh transfer pattern 1680 may contact the first initialization voltage line 1340 of FIG. 7C through the contact portion 1680CNT1 and may contact the second active pattern 1400 of FIG. 7D through the contact portions 1680CNT2 and 1680CNT3 to transmit the first initialization voltage Vint to the first initialization thin-film transistor T4.

A first planarization insulating layer 121 may cover the fourth conductive pattern 1600, and may be located on the third interlayer insulating layer 119. The first planarization insulating layer 121 may include an organic insulating material. For example, the first planarization insulating layer 121 may include a photoresist, a polyacrylic resin, a polyimide-based resin, or an acrylic resin.

Figure 7G:
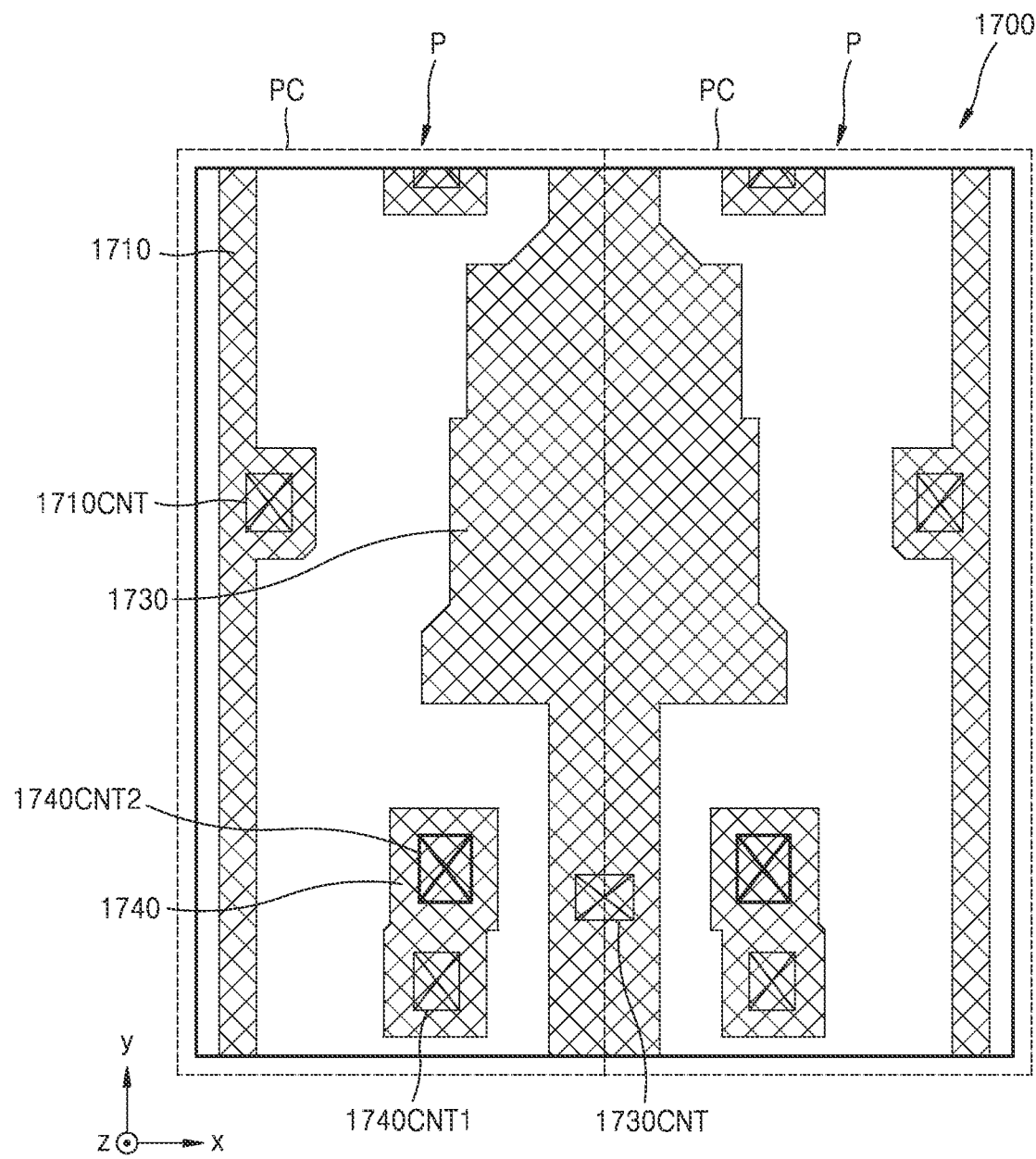

Referring to FIG. 7G with FIGS. 6 and 8, a fifth conductive pattern 1700 may be located on the first planarization insulating layer 121. The fifth conductive pattern 1700 may include a data wiring 1710, a voltage wiring 1730, and an eighth transfer pattern 1740.

The data wiring 1710 may extend in the second direction (e.g., the y direction). The data wiring 1710 may correspond to the data line DL of FIG. 5. The data wiring 1710 may contact the second transfer pattern 1620 through a contact portion 1710CNT. The data signal Dm may be transmitted to the first active pattern 1100 through the data wiring 1710 and the second transfer pattern 1620.

The voltage wiring 1730 may extend in the second direction (e.g., the y direction). The voltage wiring 1730 may correspond to the driving voltage line PL of FIG. 5. The voltage wiring 1730 may apply the driving voltage ELVDD. The voltage wiring 1730 may be connected to the fifth transfer pattern 1660 through a contact portion 1730CNT and may apply the driving voltage to the storage capacitor electrode 1330 and the operation control thin-film transistor T5.

The voltage wiring 1730 may be shared by a first pixel circuit PC1 and a second pixel circuit PC2 that are adjacent to each other. In another embodiment, the voltage wiring 1730 may be provided in each of the first pixel circuit PC1 and the second pixel circuit PC2.

The eighth transfer pattern 1740 may contact the sixth transfer pattern 1670 through a contact portion 1740CNT1. The eighth transfer pattern 1740 may transmit the driving current $I_{OLED}$ or the anode initialization voltage Aint from the sixth transfer pattern 1670 to the organic light-emitting diode OLED.

Also, the eighth transfer pattern 1740 may contact a pixel electrode 210 (see FIG. 8) through a contact portion 1740CNT2. The emission control thin-film transistor T6 may be electrically connected to the pixel electrode 210 through the eighth transfer pattern 1740.

The second planarization insulating layer 123 may cover the fifth conductive pattern 1700, and may be located on the first planarization insulating layer 121. The second planarization insulating layer 123 may include an organic insulating material. For example, each of the first planarization insulating layer 121 and the second planarization insulating layer 123 may include benzocyclobutene (BCB), polyimide, hexamethyldisiloxane (HMDSO), a general-purpose polymer such as polymethyl methacrylate (PMMA) or polystyrene (PS), a polymer derivative having a phenol-based group, an acrylic polymer, an imide-based polymer, an aryl ether-based polymer, an amide-based polymer, a fluorinated polymer, a p-xylene-based polymer, a vinyl alcohol-based polymer, or a blend thereof.

Referring to FIG. 8, the organic light-emitting diode OLED is located on the second planarization insulating layer 123. The organic light-emitting diode OLED includes the pixel electrode 210, an intermediate layer 220 including an organic emission layer, and a counter electrode 230.

The pixel electrode 210 may be a (semi-)transmissive electrode or a reflective electrode. In an embodiment, the pixel electrode 210 may include a reflective layer formed of silver (Ag), magnesium (Mg), aluminum (Al), platinum (Pt), palladium (Pd), gold (Au), nickel (Ni), neodymium (Nd), iridium (Jr), chromium (Cr), or a compound thereof, and a transparent or semi-transparent electrode layer on the reflective layer. The transparent or semi-transparent electrode layer may include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). For example, the pixel electrode 210 may include ITO/Ag/ITO.

A pixel-defining film 125 may be located on the second planarization insulating layer 123. The pixel-defining film 125 may increase a distance between an edge of the pixel electrode 210 and the counter electrode 230 located over the pixel electrode 210 to prevent an arc or the like from occurring on the edge of the pixel electrode 210.

The pixel-defining film 125 may be formed of at least one organic insulating material selected from the group consisting of polyimide, polyamide, acrylic resin, benzocyclobutene, and phenolic resin by using spin coating or the like.

The intermediate layer 220 of the organic light-emitting diode OLED may be located in an opening OP formed by the pixel-defining film 125. An emission area EA of the organic light-emitting diode OLED may be defined by the opening OP.

The intermediate layer 220 may include a first functional layer 221, an organic emission layer 222, and a second functional layer 223. The organic emission layer 222 may include an organic material including a fluorescent or phosphorescent material that emits red, green, blue, or white light. The organic emission layer 222 may be located to correspond to each of the pixel electrodes 210 for each pixel P. The organic emission layer 222 may be formed of a low molecular weight organic material or a high molecular weight organic material. The first functional layer 221 and/or the second functional layer 223 including at least one of a hole transport layer (HTL), a hole injection layer (HIL), an electron transport layer (ETL), and an electron injection layer (EIL) may be located under and over the organic emission layer 222.

The counter electrode 230 may be a light-transmitting electrode or a reflective electrode. In some embodiments, the counter electrode 230 may be a transparent or semi-transparent electrode, and may include a metal thin film having a low work function including lithium (Li), calcium (Ca), LiF/Ca, LiF/Al, aluminum (Al), silver (Ag), magnesium (Mg), or a compound thereof. Also, a transparent conductive oxide (TCO) film including ITO, IZO, ZnO, or $In_2O_3$ may be further located on the metal thin film. The counter electrode 230 may be integrally formed over the display area DA, and may be located on the intermediate layer 220 and the pixel-defining film 125.

A bottom metal layer BML may be located under the pixel circuit PC of the display area DA. The bottom metal layer BML may be located between the substrate 100 and the buffer layer 111. The substrate 100 may have a structure in which a first organic layer, a first inorganic layer, a second organic layer, and a second inorganic layer are sequentially stacked, and the bottom metal layer BML may be located on the second inorganic layer. The bottom metal layer BML may include, for example, a metal, an alloy, a conductive metal oxide, or a transparent conductive material like the first conductive pattern 1200. The bottom metal layer BML may include, for example, molybdenum (Mo) or an alloy containing molybdenum.

The bottom metal layer BML may overlap at least one of the first through seventh thin-film transistors (e.g., T1 through T7) of the pixel circuit PC. Although the bottom metal layer BML is located under the first, fourth, and sixth thin-film transistors T1, T4, and T6 and overlaps an entire surface of the pixel circuit PC in FIG. 8, the disclosure is not limited thereto. The bottom metal layer BML may necessarily overlap the first thin-film transistor (e.g., T1) that is a driving thin-film transistor and may selectively overlap the remaining second through seventh thin-film transistors (e.g., T2 through T7).

Referring to FIG. 8, in the intermediate area MA adjacent to the display area DA, bypassing portions of signal lines for bypassing the first opening area OA1 and the second opening area OA2 as shown in FIG. 4 may be located.

First, the first scan line SL1 described with reference to FIG. 5 may be located on the same layer as a first gate electrode G1 of the first thin-film transistor T1 to correspond to the first gate wiring 1210 of FIG. 7B in the display area DA.

Figure 16:
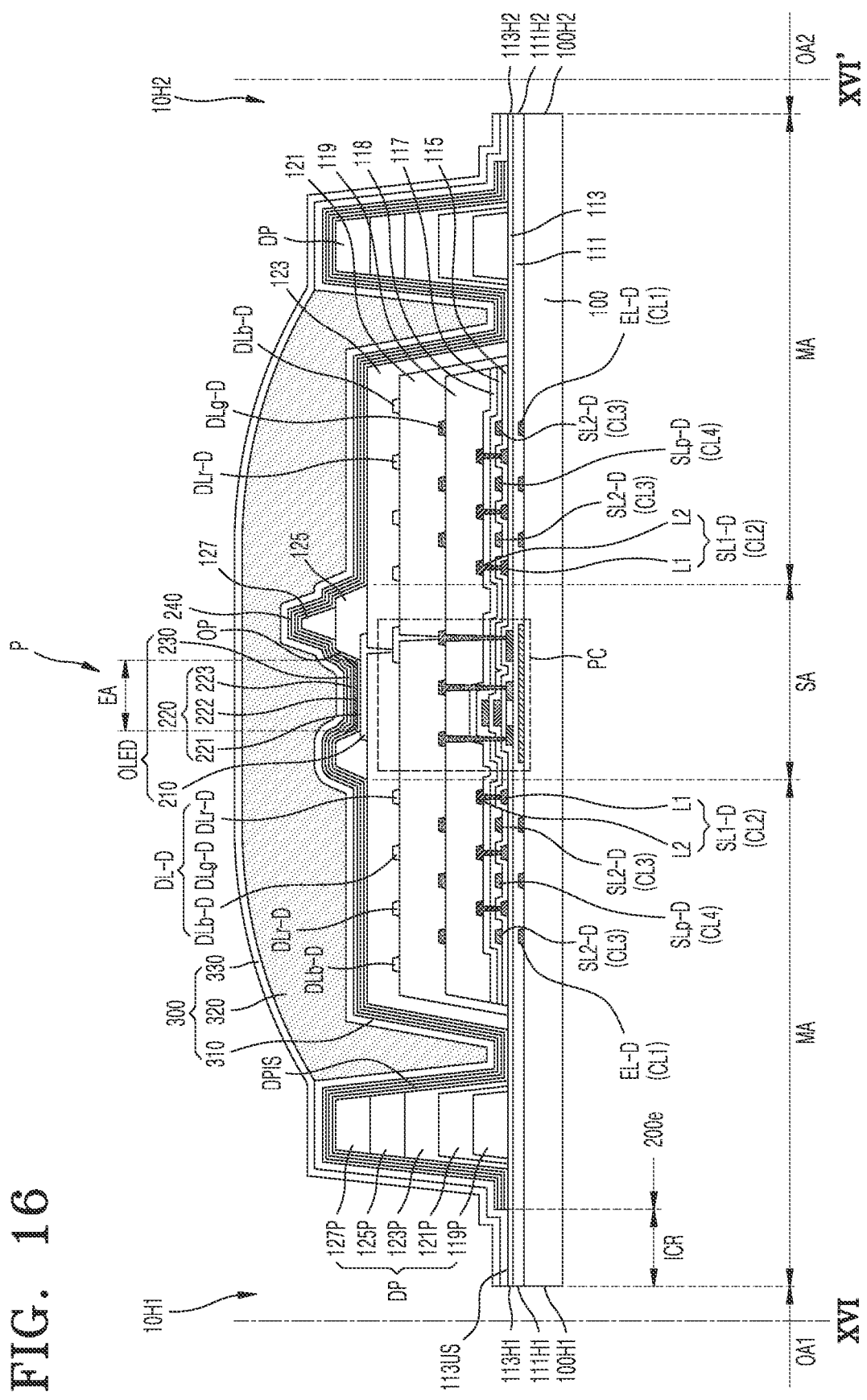
FIG. 16 is a cross-sectional view illustrating a part of a display panel including opening areas according to an embodiment.

The first scan line SL1 may be located on the first gate insulating layer 113. In the intermediate layer MA, a bypassing portion SL1-D of the first scan line SL1 may be provided as a second conductive layer CL2, and the second conductive layer CL2 may be provided as a double wiring in which a first layer L1 and a second layer L2 are connected as shown in FIG. 16. In an embodiment, the first layer L1 and the gate electrode of the first thin-film transistor T1 may include the same material and may be located on the same layer, and the second layer L2 and the gate electrode of the fourth thin-film transistor (e.g., T4) may include the same material and may be located on the same layer. The first layer L1 and the second layer L2 may be connected to each other through a contact hole formed in insulating layers located between the first layer L1 and the second layer L2.

A bypassing portion SL2-D of the second scan line SL2 and a bypassing portion SLp-D of the previous scan line SLp described with reference to FIG. 5 may be located on the first interlayer insulating layer 114. The bypassing portion SL2-D of the second scan line SL2 may be provided as a third conductive layer CL3 and the bypassing portion SLp-D of the previous scan line SLp may be provided as a fourth conductive layer CL4. The bypassing portion SL2-D of the second scan line SL2 and the bypassing portion SLp-D of the previous scan line SLp of the second conductive layer CL4 may be alternately located on the same layer. The third conductive layer CL3 that is the bypassing portion SL2-D of the second scan line SL2 and the fourth conductive layer CL4 that is the bypassing portion SLp-D of the previous scan line SLp may be alternately located so as not to overlap the second conductive layer CL2 (e.g., the first layer L1) that is the bypassing portion SL1-D of the first scan line SL1. Such an arrangement structure may be commonly applied to bypassing portions of signal lines, and thus profiles of insulating layers between the bypassing portions or covering the bypassing portions may be smoothed, and parasitic capacitance between adjacent signal lines may be reduced.

A bypassing portion DL-D of the data line DL may be located on the third interlayer insulating layer 119 and the first planarization layer 121. In an embodiment, a bypassing portion DLg-D of the data line DL for applying a data signal to a green sub-pixel may be located on the third interlayer insulating layer 119, and bypassing portions DLr-D and DLb-D of the data line DL for applying a data signal to a red sub-pixel and a blue sub-pixel, respectively, may be located on the first planarization insulating layer 121. As described above, the bypassing portion DLg-D of the data line DL located on the third interlayer insulating layer 119 and the bypassing portions DLr-D and DLb-D of the data line DL located on the first planarization insulating layer 121 may be alternately located so as not to overlap each other in a plan view.

Figure 9:
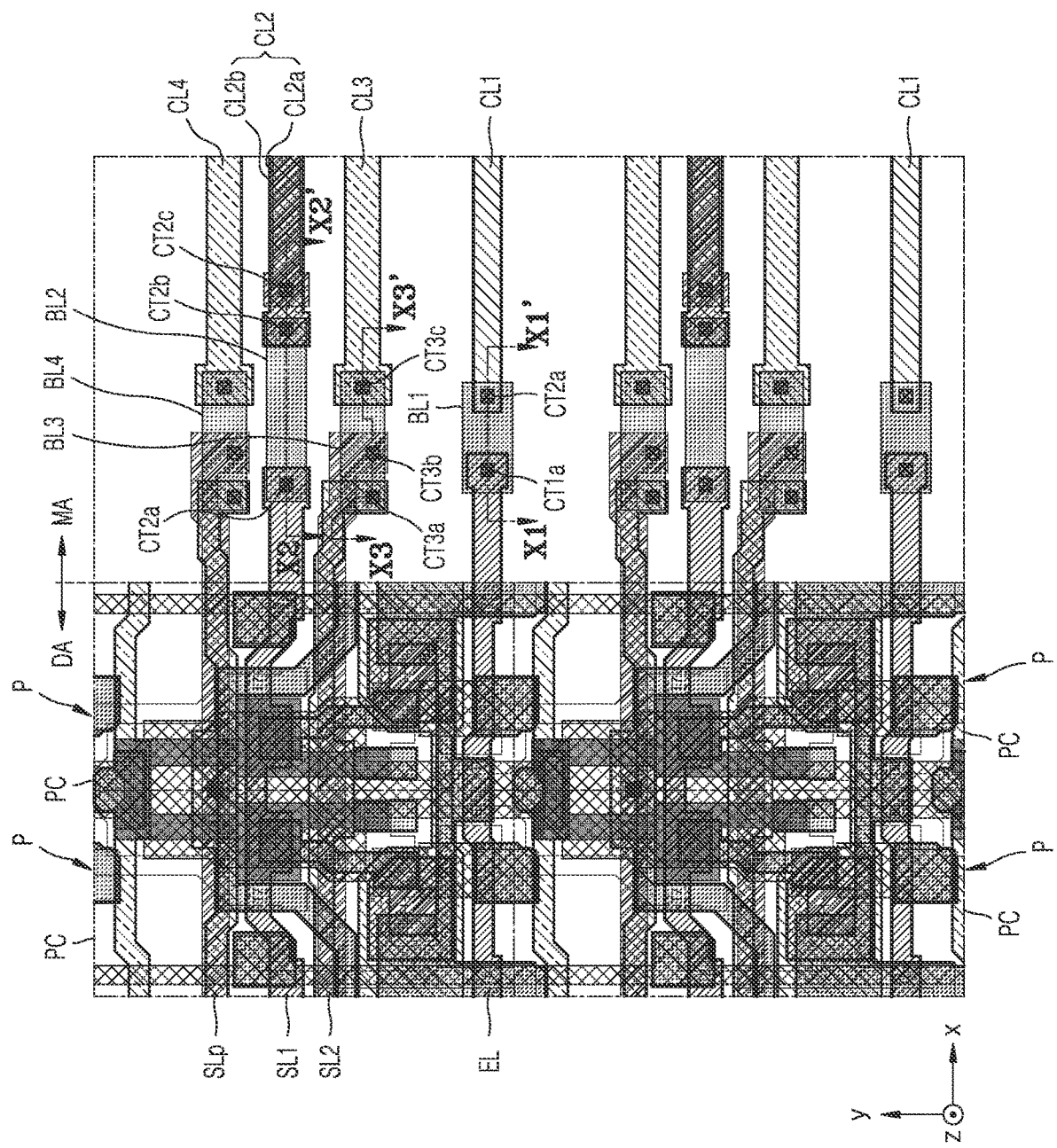
FIG. 9 is a plan view illustrating a part of a display panel according to an embodiment.
Figure 10:
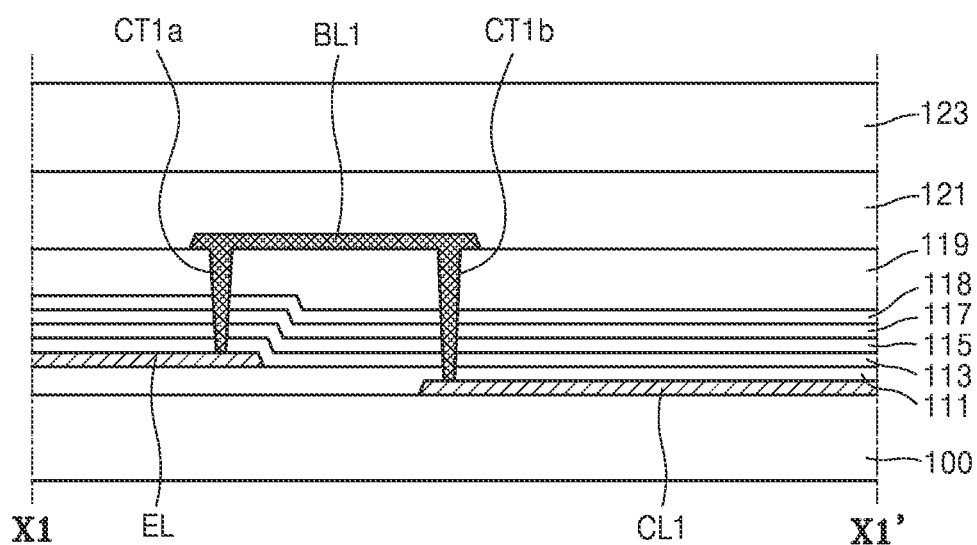
FIG. 10 is a cross-sectional view taken along line X1-X1' of FIG. 9.
Figure 11:
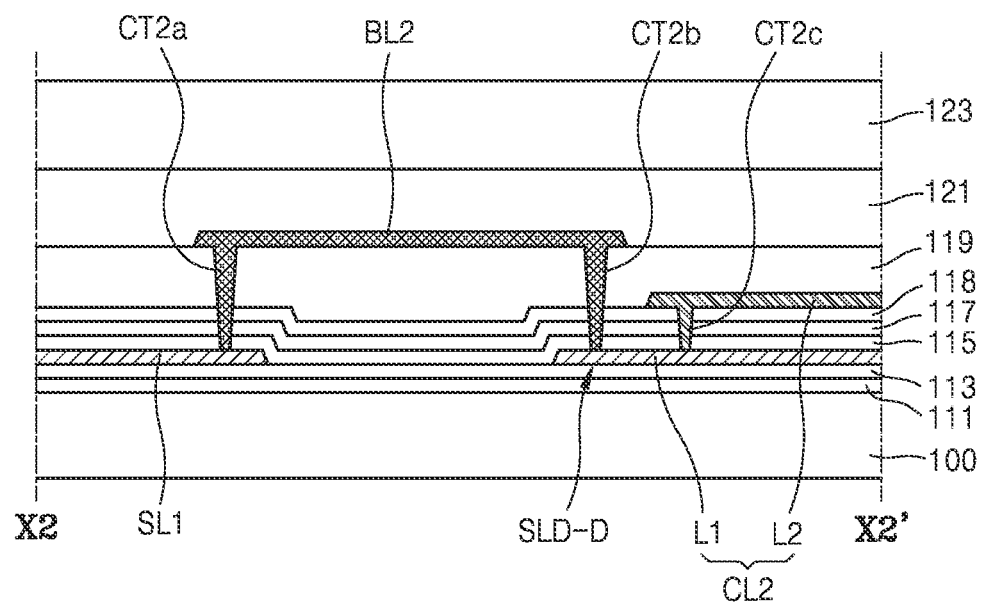
FIG. 11 is a cross-sectional view taken along line X2-X2' of FIG. 9.

FIG. 9 is a plan view illustrating a part of a display panel according to an embodiment. FIG. 10 is a cross-sectional view taken along line X1-X1' of FIG. 9. FIG. 11 is a cross-sectional view taken along line X2-X2' of FIG. 9. FIG. 12 is a cross-sectional view taken along line X3-X3' of FIG. 9.

Referring to FIG. 9, the pixels P each including the pixel circuit PC may be located in the display area DA. Bypassing portions of signal lines for bypassing the first opening area OA1 and/or the second opening area OA2 described with reference to FIG. 4 may be located in the intermediate area MA at a side of the display area DA. FIG. 10 illustrates a connection relationship between signal lines and bypassing portions of the signal lines at a boundary between the display area DA and the intermediate area MA.

The emission control line EL may extend in the first direction (e.g., the ±x direction) in the display area DA and may be electrically connected to the first conductive layer CL1 at the boundary between the display area DA and the intermediate area MA. As described above, the first conductive layer CL1 may correspond to a bypassing portion EL-D of the emission control line EL. In an embodiment, the emission control line EL and the first conductive layer CL1 may be directly connected to each other, or may be electrically connected through a first bridge layer BL1 as shown in FIGS. 9 and 10.

Referring to FIGS. 9 and 10, the first conductive layer CL1 may be located on the substrate 100. The first conductive layer CL1 and the bottom metal layer BML described with reference to FIG. 8 may be located on the same layer. When the first conductive layer CL1 and the bottom metal layer BML are located on the same layer, it may mean that the first conductive layer CL1 and the bottom metal layer BML may be patterned by the same mask process and may include the same material. The emission control line EL may be located on the first gate insulating layer 113.

The first bridge layer BL1 may be located on the emission control line EL and the first conductive layer CL1. In an embodiment, the first bridge layer BL1 may be located on the third interlayer insulating layer 119, and may be located on the same layer as the fourth conductive pattern 1600 described with reference to FIG. 7F. In other words, the first bridge layer BL1 may include the same material and may be located on the same layer as first electrode layers S1 and D1 and second electrode layers S2 and D2 of FIG. 8. A side of the first bridge layer BL1 may be connected to the emission control line EL through a contact hole CT1a passing through insulating layers (e.g., the first interlayer insulating layer 115, the second interlayer insulating layer 117, the second gate insulating layer 118, and the third interlayer insulating layer 119), and the other side of the first bridge layer BL1 may be connected to the first conductive layer CL1 through a contact hole CT1b passing through insulating layers (e.g., the buffer layer 111, the first gate insulating layer 113, the first interlayer insulating layer 115, the second interlayer insulating layer 117, the second gate insulating layer 118, and the third interlayer insulating layer 119). Because the first bridge layer BL1 may be formed to have resistance lower than that of the emission control line EL and the first conductive layer CL1, when the emission control line EL and the first conductive layer CL1 are connected to each other through the first bridge layer BL1, resistance may be reduced and an area may be efficiently utilized.

Unlike in FIG. 10, when the emission control line EL and the first conductive layer CL1 are directly connected to each other, the emission control line EL and the first conductive layer CL1 may be connected to each other through a contact hole passing through the buffer layer 111.

Referring back to FIG. 7B, the first scan line SL1 and the emission control line EL may be located on the same layer. The first scan line SL1 may extend in the first direction (e.g., the ±x direction) in the display area DA and may be electrically connected to the second conductive layer CL2 in the intermediate area MA. As described above, the second conductive layer CL2 may correspond to the bypassing portion SL1-D of the first scan line SL1. In an embodiment, the first scan line SL1 and the second conductive layer CL2 may be directly connected to each other, or may be electrically connected to each other through a second bridge layer BL2 as shown in FIG. 9.

Referring to FIGS. 9 and 11, in an embodiment, the second conductive layer CL2 may be provided as a double wiring in the intermediate area MA. The second conductive layer CL2 may include the first layer L1 located on the first gate insulating layer 113 and the second layer L2 located on the second gate insulating layer 118. The first layer L1 and the second layer L2 may be connected to each other through a contact hole CT2c passing through insulating layers (e.g., the first interlayer insulating layer 115, the second interlayer insulating layer 117, and the second gate insulating layer 118).

In an embodiment, the second bridge layer BL2 may be located on the third interlayer insulating layer 119 and may be located on the same layer as the fourth conductive pattern 1600 of FIG. 7F. A side of the second bridge layer BL2 may be connected to the first scan line SL1 through a contact hole CT2a passing through insulating layers (e.g., the first interlayer insulating layer 115, the second interlayer insulating layer 117, the second gate insulating layer 118, and the third interlayer insulating layer 119), and the other side of the second bridge layer BL2 may be connected to the first layer L1 of the second conductive layer CL2 through a contact hole CT2b passing through insulating layers (e.g., the first interlayer insulating layer 115, the second interlayer insulating layer 117, the second gate insulating layer 118, and the third interlayer insulating layer 119). Although the second bridge layer BL2 is connected to the first layer L1 in FIG. 11, in another embodiment, the second bridge layer BL2 may be connected to the second layer L2 through a contact hole formed in the third interlayer insulating layer 119.

Referring back to FIG. 7C, the second scan line SL2 (1320) and the previous scan line SLp (1310) may be located on the same layer. The second scan line SL2 and the previous scan line SLp may extend in the first direction (e.g., the ±x direction) in the display area DA and may be electrically connected to the third conductive layer CL3 and the fourth conductive layer CL4 in the intermediate area MA, respectively. As described above, the third conductive layer CL3 may correspond to the bypassing portion SL2-D of the second scan line SL2, and the fourth conductive layer CL4 may correspond to the bypassing portion SLp-D of the previous scan line SLp. In an embodiment, the second scan line SL2 and the third conductive layer CL3 may be directly connected to each other, or may be electrically connected to each other through a third bridge layer BL3 as shown in FIG. 9. Also, the previous scan line SLp and the fourth conductive layer CL4 may be directly connected to each other, or may be electrically connected to each other through a fourth bridge layer BL4 as shown in FIG. 9.

Referring to FIGS. 9 and 12, in an embodiment, the second scan line SL2 and the previous scan line SLp may be provided as a double wiring in the display area DA. As shown in FIG. 12, the second scan line SL2 may be provided as a double wiring in which the fourth gate wiring 1320 of FIG. 7C and the fifth gate wiring 1530 of FIG. 7E are connected to each other. Also, the previous scan line SLp may be provided as a double wiring in which the third gate wiring 1310 of FIG. 7C and the second gate wiring 1520 of FIG. 7E are connected to each other.

In an embodiment, the third bridge layer BL3 may be located on the third interlayer insulating layer 119 and may be located on the same layer as the fourth conductive pattern 1600 described with reference to FIG. 7F. A side of the third bridge layer BL3 may be connected to the fifth gate wiring 1530 through a contact hole CT3a passing through insulating layers (e.g., the third interlayer insulating layer 119), and may be connected to the fourth gate wiring 1320 through a contact hole CT3b passing through insulating layers (e.g., the second interlayer insulating layer 117, the second gate insulating layer 118, and the third interlayer insulating layer 119). The other side of the third bridge layer BL3 may be connected to the third conductive layer CL3 through a contact hole CT3c passing through insulating layers (e.g., the second interlayer insulating layer 117, the second gate insulating layer 118, and the third interlayer insulating layer 119).

The previous scan line SLp may have a connection structure, like the second scan line SL2 described with reference to FIG. 12.

Figure 13:
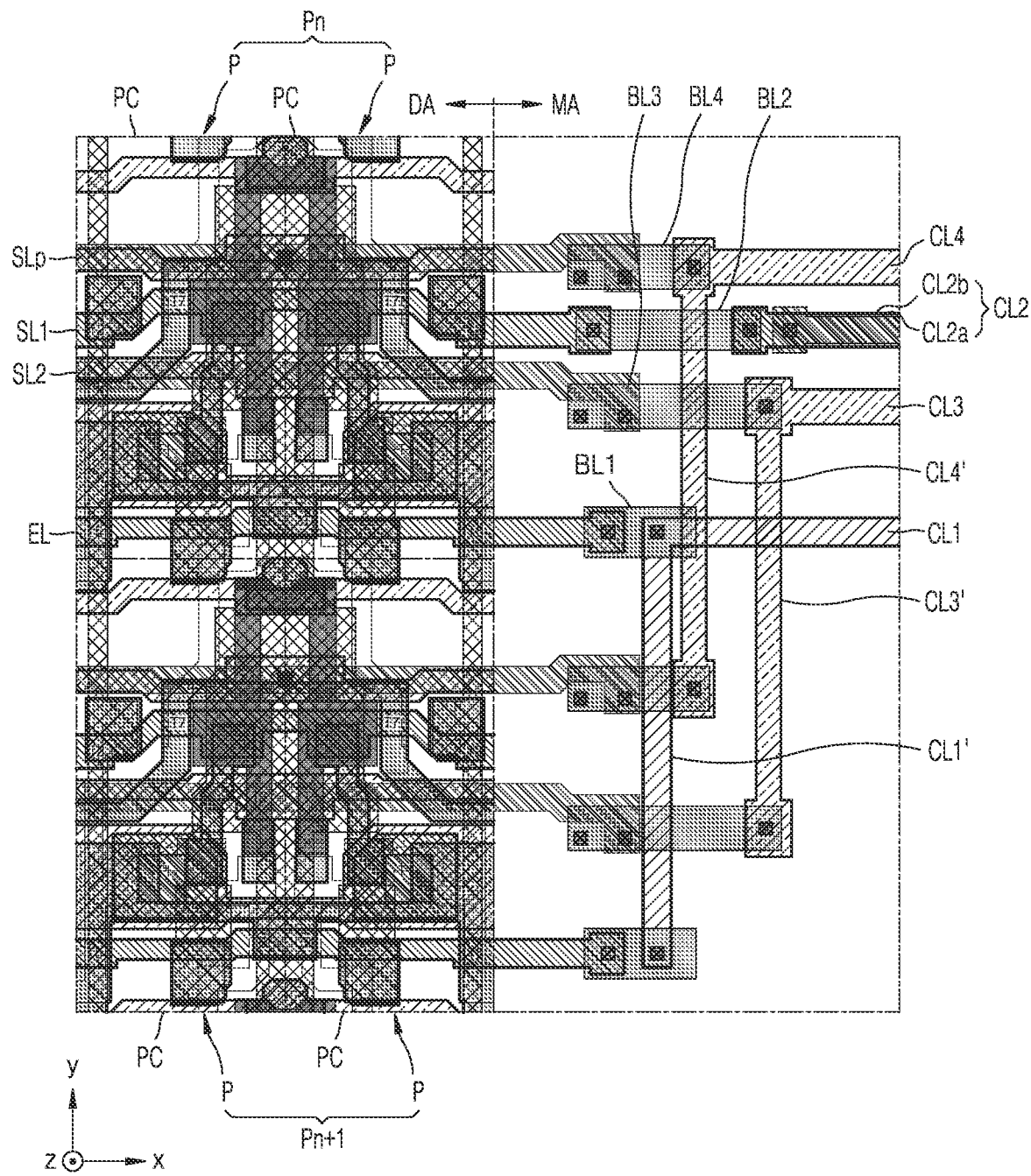
FIG. 13 is a plan view illustrating a part of a display panel according to an embodiment.

FIG. 13 is a plan view illustrating a part of a display panel according to an embodiment which is a modification of FIG. 9.

A structure of the display panel of FIG. 13 is mostly similar to a structure of a display panel of FIG. 9, but there is a difference in a connection structure in the intermediate area MA. The following will focus on the difference and the same description as that made with reference to FIGS. 9 through 12 will be omitted.

Referring to FIG. 13, in the display area DA, pixels Pn located in an $n^{th}$ row and pixels Pn+1 located in an $n+1^{th}$ row adjacent to the $n^{th}$ row may be provided. The pixels Pn located in the $n^{th}$ row and the pixels Pn+1 located in the $n+1^{th}$ row may have the same pixel circuit PC.

In the intermediate area MA, bypassing portions connected to signal lines of the pixel circuit PC may be located. In an embodiment, in the intermediate area MA, the first conductive layer CL1 connected to the emission control line EL may be located, and the second conductive layer CL2 connected to the first scan line SL1, the third conductive layer CL3 connected to the second scan line SL2, and the fourth conductive layer CL4 connected to the previous scan line SLp may be located.

In an embodiment, one first conductive layer CL1 may be electrically connected to the emission control line EL of the pixels Pn located in the $n^{th}$ row and the emission control line EL of the pixels Pn+1 located in the $n+1^{th}$ row. The first conductive layer CL1 may include a first connector CL1' for connecting the emission control line EL of the pixels Pn to the emission control line EL of the pixels Pn+1 located in the $n+1^{th}$ row. For example, the first connector CL1' may be integrally formed with the first conductive layer CL1, and may extend in the second direction (e.g., the ±y direction).

Also, one third conductive layer CL3 may be electrically connected to the second scan line SL2 of the pixels Pn located in the $n^{th}$ row and the second scan line SL2 of the pixels Pn+1 located in the $n+1^{th}$ row. The third conductive layer CL3 may include a third connector CL3' for connecting the second scan line SL2 of the pixels Pn to the second scan line SL2 of the pixels Pn+1 located in the $n+1^{th}$ row. The third connector CL3' may be integrally formed with the third conductive layer CL3, and may extend in the second direction (e.g., the ±y direction).

Also, one fourth conductive layer CL4 may be electrically connected to the previous scan line SLp of the pixels Pn located in the $n^{th}$ row and the previous scan line SLp of the pixels Pn+1 located in the $n+1^{th}$ row. The third conductive layer CL3 may include a fourth connector CL4' for connecting the previous scan line SLp of the pixels Pn to the previous scan line SLp of the pixels Pn+1 located in the $n+1^{th}$ row. The fourth connector CL4' may be integrally formed with the fourth conductive layer CL4, and may extend in the second direction (e.g., the ±y direction).

As such, because bypassing portions of signal lines located in the intermediate area MA are electrically connected to the pixels Pn located in the $n^{th}$ row and the pixels Pn+1 of the $n+1^{th}$ row that is adjacent to the $n^{th}$ row, the number of the first conductive layers CL1 (and/or the third conductive layers CL3 and the fourth conductive layers CL4) located in the intermediate area MA may be reduced by half, thereby reducing the size of the intermediate area MA and minimizing signal interference between the bypassing portions of the signal lines.

Figure 14:
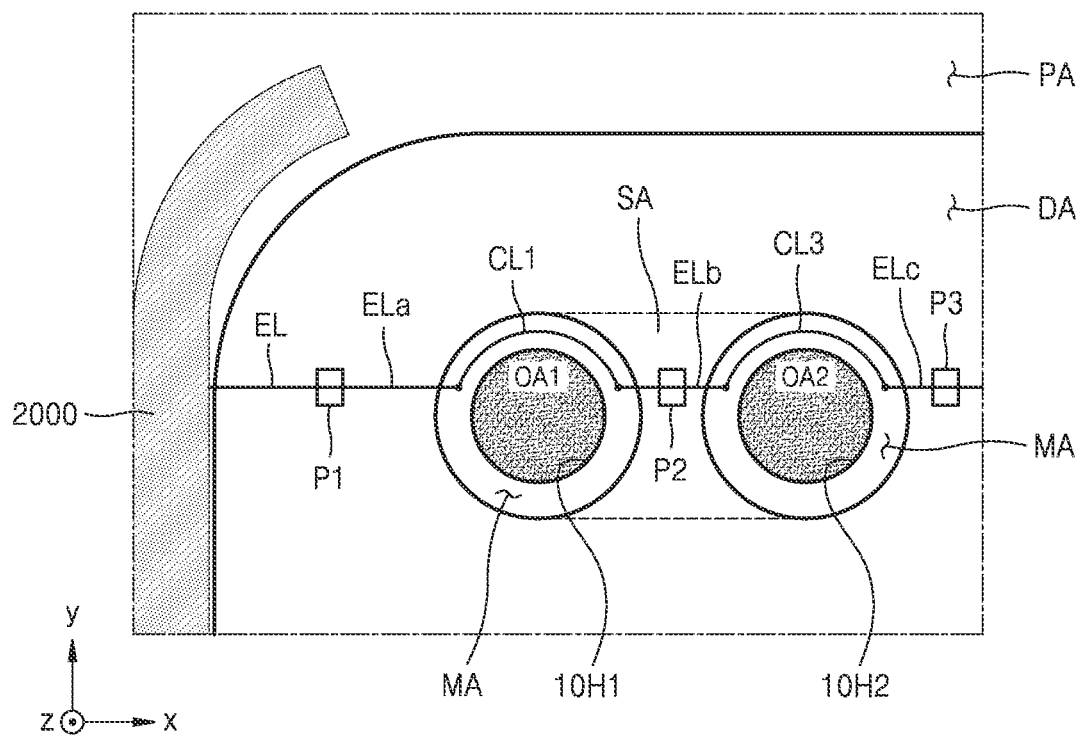
FIG. 14 is a plan view illustrating a part of a display panel according to an embodiment.

FIG. 14 is a plan view illustrating a part of a display panel according to an embodiment.

Referring to FIG. 14, a plurality of pixels P located in the display area DA may include a first pixel P1, a second pixel P2, and a third pixel P3. The first pixel P1 may be located in the display are DA between the first opening 10H1 and one peripheral area PA, the second pixel P2 may be located in the display area DA (i.e., the separation area SA) between the first opening OA1 and the second opening OA2, and the third pixel P3 may be located in the display area DA between the second opening OA2 and the other peripheral area PA which opposes the one peripheral area with the display area DA disposed therebetween. The first pixel P1, the second pixel P2, and the third pixel P3 are sub-pixels each including a display element, and the first pixel P1, the second pixel P2, and the third pixel P3 may be sub-pixels located in the same row. Accordingly, the first pixel P1, the second pixel P2, and the third pixel P3 may be connected to the emission control line EL to which the same emission control signal En is applied.

Some of the emission control lines EL located in the display area DA may be physically separated from one another by the first opening 10H1 (or the first opening area OA1) and the second opening 10H2 (or the second opening area OA2). The emission control line EL may include a first portion ELa located in the display area DA between the first opening 10H1 and the one peripheral area PA and electrically connected to the first pixel P1, a second portion ELb located in the display area DA (i.e., the separation area SA) between the first opening OA1 and the second opening OA2 and electrically connected to the second pixel P2, and a third portion ELc located in the display area DA between the second opening OA2 and the other peripheral area PA which opposes the one peripheral area with the display area DA disposed therebetween and electrically connected to the third pixel P3. As described above, the first portion ELa, the second portion ELb, and the third portion ELc of the emission control line EL may be physically separated from one another by the first opening 10H1 (or the first opening area OA1) and the second opening 10H2 (or the second opening area OA2).

The first portion ELa, the second portion ELb, and the third portion ELc of the emission control line EL may be electrically connected to one another by the first conductive layer CL1 located in the intermediate area MA to bypass the first opening 10H1 and the second opening 10H2. In detail, the first conductive layer CL1 bypassing the first opening 10H1 may electrically connect the first portion ELa to the second portion ELb, and the third conductive layer CL3 bypassing the second opening 10H2 may electrically connect the second portion ELb to the third portion ELc. A specific connection structure is the same as that described with reference to FIGS. 10 through 12.

Figure 15:
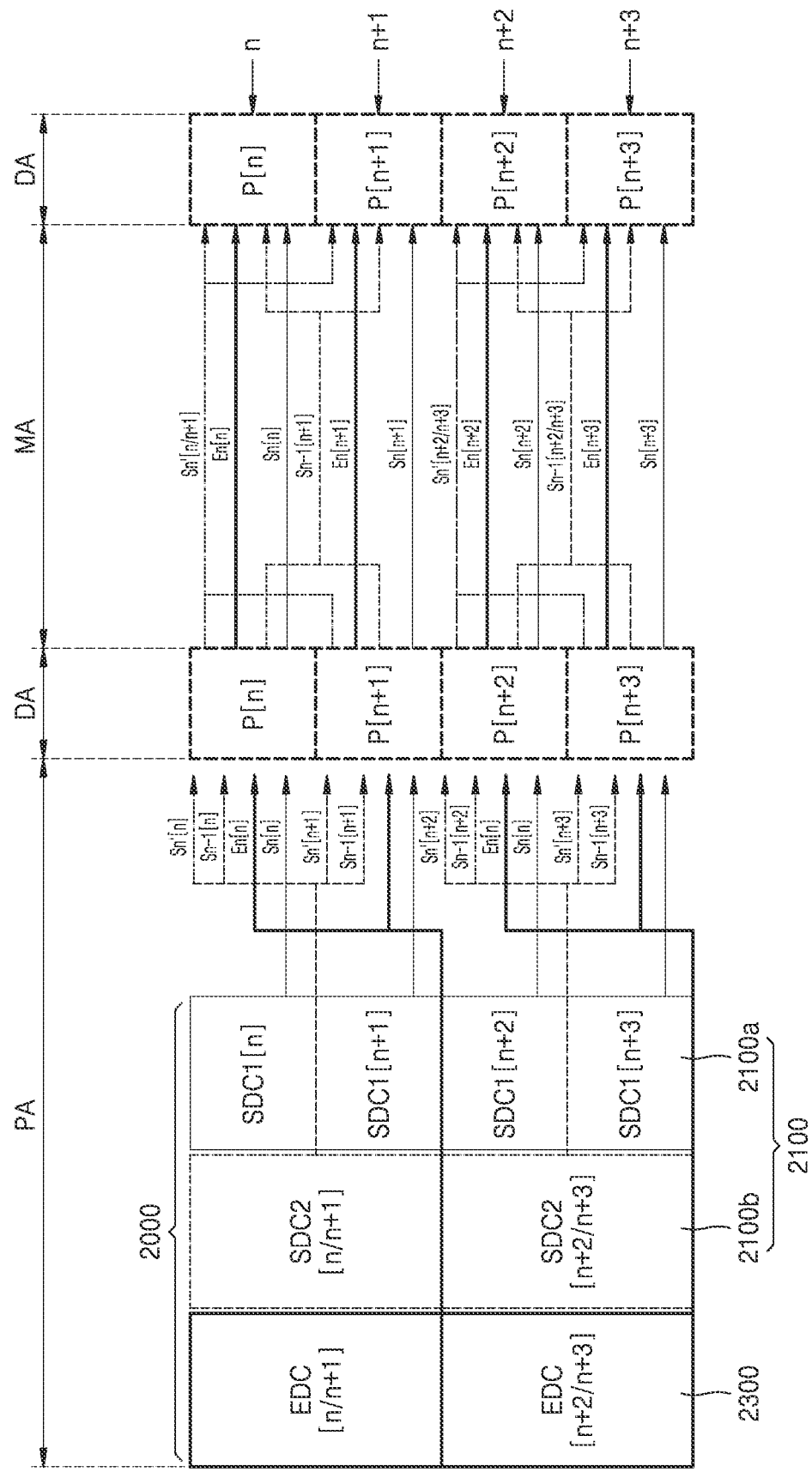
FIG. 15 is a view illustrating a connection relationship between signal lines of a display panel according to an embodiment.

FIG. 15 is a view illustrating a connection relationship between signal lines of a display panel according to an embodiment.

FIG. 15 specifically illustrates a connection relationship between signal lines described with reference to FIG. 14. First, driving circuits 2000 may be located in the peripheral area PA. The driving circuits 2000 may include the scan driver 2100 and the emission control driver 2300 as described with reference to FIG. 3. The scan driver 2100 may include a first scan driver 2100a located adjacent to the display area Da, and a second scan driver 2100b located between the first scan driver 2100a and the emission control driver 2300. The first scan driver 2100a may apply first scan signals Sn[n], Sn[n+1], Sn[n+2], Sn[n+3] . . . , and the second scan driver 2100b may apply second scan signals Sn'[n], Sn'[n+1], Sn' [n+2], Sn' [n+3] . . . and/or previous scan signals Sn−1[n], Sn—1 [n+1], Sn−1[n+2], Sn−1[n+3] . . . .

In an embodiment, the first scan driver 2100a may include a plurality of first scan driving circuits SDC1[n], SDC1[n+1], SDC1[n+2], and SDC1[n+3], the second scan driver 2100b may include a plurality of second scan driving circuits SDC2[n/n+1] and SDC2[n+2/n+3], and the emission control driver 2300 may include a plurality of emission control driving circuits EDC[n/n+1] and EDC[n+2/n+3]. For example, the number of the plurality of second scan driving circuits SDC2[n/n+1] and SDC2[n+2/n+3] and/or the plurality of emission control driving circuits EDC[n/n+1] and EDC[n+2/n+3] may be ½ of the number of the plurality of first scan driving circuits SDC1 [n], SDC1 [n+1], SDC1 [n+2], and SDC1 [n+3].

In the display area DA, pixels P[n], P[n+1], P[n+2], and P[n+3] respectively located in $n^{th}$, $n+1^{th}$, $n+2^{th}$, and $n+3^{th}$ rows may be located. In an embodiment, the pixel P[n] of the $n^{th}$ row may receive the first scan signal Sn[n] from the first scan driving circuit SDC1[n], the pixel P[n+1] of the $n+1^{th}$ row may receive the first scan signal Sn[n+1] from the first scan driving circuit SDC1[n+1]), the pixel P[n+2] of the $n+2^{th}$ row may receive the first scan signal Sn[n+2] from the first scan driving circuit SDC1[n+2], and the pixel P[n+3] of the $n+3^{th}$ row may receive the first scan signal Sn[n+3] from the first scan driving circuit SDC1[n+3]. Also, the pixel P[n] of the $n^{th}$ row and the pixel P[n+1] of the $n+1^{th}$ row may receive the second scan signals Sn'[n] and Sn' [n+1] and/or the previous scan signals Sn−1[n] and Sn−1 [n+1] from the second scan driving circuit SDC2, and the pixel P[n+2] of the $n+2^{th}$ row and the pixel P[n+3] of the $n+3^{th}$ row may receive the second scan signals Sn' [n+2] and Sn'[n+3] and/or the previous scan signals Sn−1 [n+2] and Sn−1 [n+3] from the second scan driving circuit SDC2. Also, the pixel P[n] of the $n^{th}$ row and the pixel P[n+1] of the $n+1^{th}$ row may receive emission control signals En[n] and En[n+1] from the emission control driving circuit EDC, and the pixel P[n+2] of the $n+2^{th}$ row and the pixel P[n+3] of the $n+3^{th}$ row may receive emission control signals En[n+2] and En[n+3] from the emission control driving circuit EDC.

In the intermediate area MA, some of conductive layers constituting bypassing portions of signal lines may be shared by pixels located in adjacent rows. In an embodiment, the first conductive layer CL1 that transmits an emission control signal may be shared by the pixel P[n] of the $n^{th}$ row and the pixel P[n+1] of the $n+1^{th}$ row, and an emission control signal may be transmitted through one first conductive layer CL1. Likewise, the third conductive layer CL3 that transmits a second scan signal may be shared by the pixel P[n] of the $n^{th}$ row and the pixel P[n+1] of the $n+1^{th}$ row and a second scan signal may be transmitted through one third conductive layer CL3, and the fourth conductive layer CL4 that transmits a previous scan signal may be shared by the pixel P[n] of the $n^{th}$ row and the pixel P[n+1] of the $n+1^{th}$ row and a previous scan signal may be transmitted through one fourth conductive layer CL4.

Referring to FIG. 16, the pixel P may be located in the separation area SA. The pixel P may include the pixel circuit PC and may include the organic light-emitting diode OLED electrically connected to the pixel circuit PC. The emission area EA of the pixel P may be defined by the opening OP of the pixel-defining film 125.

In an embodiment, a spacer 127 may be further located on the pixel-defining film 125. The spacer 127 may include an organic insulating material such as polyimide. Alternatively, the spacer 127 may include an inorganic insulating material such as silicon nitride ($SiN_x$) or silicon oxide (SiOx), or may include an organic insulating material and an inorganic insulating material.

In an embodiment, the spacer 127 may include a material different from that of the pixel-defining film 125. In another embodiment, the spacer 127 may include the same material as that of the pixel-defining film 125, and in this case, the pixel-defining film 125 and the spacer 127 may be formed together in a mask process using a halftone mask or the like.

The organic light-emitting diode OLED may include the pixel electrode 210, the intermediate layer 220, and the counter electrode 230 as described with reference to FIG. 8. In an embodiment, a capping layer 240 may be further located on the counter electrode 230 as shown in FIG. 16. The capping layer 215 may include LiF, an inorganic material, and/or an organic material.

In FIG. 16, the intermediate layer 220 of the organic light-emitting diode OLED may include the first functional layer 221 and the second functional layer 223 with the patterned emission layer 222 disposed therebetween. The first functional layer 221 may include, for example, a hole transport layer (HTL), or may include a hole transport layer and a hole injection layer (HIL). The second functional layer 223 may include an electron transport layer (ETL) and/or an electron injection layer (EIL). The first functional layer 221 and/or the second functional layer 223 may be a common layer entirely covering the substrate 100, like the common electrode 230 described below.

A thin-film encapsulation layer 300 may cover the organic light-emitting diode OLED. The thin-film encapsulation layer 300 may be located on the counter electrode 230 and/or the capping layer 240. In an embodiment, the thin-film encapsulation layer 300 may include at least one inorganic encapsulation layer and at least one organic encapsulation layer. In FIG. 16, the thin-film encapsulation layer 300 includes a first inorganic encapsulation layer 310, an organic encapsulation layer 320, and a second inorganic encapsulation layer 330 that are sequentially stacked.

The first inorganic encapsulation layer 310 and the second inorganic encapsulation layer 330 may extend from the display area DA to the intermediate area MA. The first inorganic encapsulation layer 310 and the second inorganic encapsulation layer 330 may extend to the peripheral area PA described with reference to FIG. 14. The first inorganic encapsulation layer 310 and the second inorganic encapsulation layer 330 may be entirely or continuously located in the intermediate area MA. The first inorganic encapsulation layer 310 and the second inorganic encapsulation layer 330 may extend to a dam portion DP, and may contact each other on a top surface of the dam portion DP. The first inorganic encapsulation layer 310 and the second inorganic encapsulation layer 330 may extend to the first opening area OA1 and the second opening area OA2.

The first inorganic encapsulation layer 310 may contact a top surface 113US of an inorganic insulating layer (e.g., the first gate insulating layer 113) in the intermediate area MA located outside the dam portion DP and adjacent to the first opening area OA1 and the second opening area OA2. Although the first inorganic encapsulation layer 310 contacts the top surface 113US of the first gate insulating layer 113 in FIG. 16, an inorganic insulating layer contacting the first inorganic encapsulation layer 310 may be the first interlayer insulating layer 115, the second interlayer insulating layer 117, or the second gate insulating layer 118. Accordingly, because an inorganic contact area ICR in which an organic material layer is not located is provided on a top surface of an inorganic insulating layer, penetration of moisture into the organic light-emitting diode OLED located in the display area DA may be prevented or reduced.

The organic encapsulation layer 320 may be formed by applying a monomer and then curing the monomer. The flow of the monomer may be controlled by the dam portion DP. That is, an end portion of the organic encapsulation layer 320 may be located on a side of the dam portion DP.

At least one dam portion DP may be located in the intermediate area MA. That is, the dam portion DP may be located between the first opening area OA1 and the separation area SA and between the second opening area OA2 and the separation area SA. Such a structure of the dam portion DP may also be applied to the peripheral area PA described with reference to FIG. 14.

In an embodiment, at least one dam portion DP may be located between the first opening area OA1 and the separation area SA and between the second opening area OA2 and the separation area SA. In the specification, the dam portion DP refers to a protrusion from a reference surface. For example, the dam portion DP may protrude from a top surface one of insulating layers located on a substrate.

The dam portion DP may be formed by stacking a plurality of layers. In an embodiment, the dam portion DP may protrude from a top surface of an inorganic insulating layer (e.g., the top surface 113US of the first gate insulating layer 113). For example, the dam portion DP may protrude from a top surface of the first interlayer insulating layer 115, a top surface of the second interlayer insulating layer 117, or a top surface of the second gate insulating layer 118. Alternatively, the dam portion DP may protrude from a top surface of the buffer layer 111.

In an embodiment, the dam portion DP may include a plurality of layers 119P, 121P, 123P, 125P, and 127P. The plurality of layers 119P, 121P, 123P, 125P, and 127P may respectively include the same materials as those of the third interlayer insulating layer 119, the first planarization insulating layer 121, the second planarization insulating layer 123, the pixel-defining film 125, and the spacer 127. In another embodiment, some of the plurality of layers 119P, 121P, 123P, 125P, and 127P may be omitted.

The first functional layer 221, the second functional layer 223, the counter electrode 230, and the capping layer 240 may extend from the display area DA, that is, the separation area SA, to the intermediate area MA that is a non-display area. In an embodiment, the first functional layer 221, the second functional layer 223, the counter electrode 230, and the capping layer 240 may cover the dam portion DP, and may extend from an inner surface DPIS of the dam portion DP to the first opening area OA and the second opening area OA2.

The first functional layer 221, the second functional layer 223, the counter electrode 230, and the capping layer 240 may be disconnected in the intermediate area MA that is a non-display area. In an embodiment, ends 200e of the first functional layer 221, the second functional layer 223, the counter electrode 230, and the capping layer 240 may be located between the dam portion DP and the first opening area OA1 and between the dam portion DP and the second opening area OA2. As shown in FIG. 16, a structure in which the ends 200e of the first functional layer 221, the second functional layer 223, the counter electrode 230, and the capping layer 240 are disconnected in the intermediate area MA may be formed by using, for example, a laser lift-off method. In another embodiment, a groove may be formed by etching insulating layers to the substrate 100 in the intermediate area MA to disconnect the first functional layer 221, the second functional layer 223, the counter electrode 230, and the capping layer 240 through the groove and to form the inorganic contact area ICR. Such a structure may also be applied to the peripheral area PA of FIG. 14.

The intermediate area MA may be located between the first opening area OA1 and the separation area SA and between the second opening area OA2 and the separation area SA. The first opening area OA1 may be defined by first through holes 100H1, 111H1, and 113H1 respectively passing through the substrate 100, the buffer layer 111, and the first gate insulating layer 113, and the second opening area OA2 may be defined by second through holes 100H2, 111H2, and 113H2 respectively passing through the substrate 100, the buffer layer 111, and the first gate insulating layer 113.

In the intermediate area MA, as described with reference to FIGS. 4 through 12, the first through fourth conductive layers CL1, CL2, CL3, and CL4 corresponding to bypassing portions of signal lines may be located. In an embodiment, the bypassing portions of the signal lines may be the bypassing portions DL-D, SL1-D, SL-2, and EL-D of the data line DL, the first scan line SL1, the second scan line SL2, and the emission control line EL, which is the same as that described with reference to FIGS. 4 through 12. While the disclosure has been particularly shown and described with reference to embodiments thereof, they are provided for the purposes of illustration and it will be understood by one of ordinary skill in the art that various modifications and equivalent other embodiments may be made from the disclosure. Accordingly, the true technical scope of the disclosure is defined by the technical spirit of the appended claims.

According to the one or more embodiments, a display panel and an electronic device including an area for a component in a display area may be realized. However, the disclosure is not limited by these effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by one of ordinary skill in the art that various changes in form and details may be made therein without departing from the spirit and scope as defined by the following claims.

What is claimed is:
1. A display panel comprising:
  a substrate comprising a first opening and a second opening that are spaced apart from each other;
  a plurality of pixels located in a display area around the first opening and the second opening, each of the plurality of pixels comprising a pixel circuit comprising a first thin-film transistor and a display element connected to the pixel circuit;
  a bottom metal layer located between the substrate and the first thin-film transistor;
  emission control lines located on the substrate, extending in a first direction, and spaced apart from each other by the first opening and the second opening; and
  a first conductive layer located in an intermediate area surrounding each of the first opening and the second opening to bypass the first opening and the second opening,
  wherein the first conductive layer electrically connects the emission control lines that are spaced apart from each other by the first opening and the second opening, and the first conductive layer comprises a same material as a material of the bottom metal layer.

2. The display panel of claim 1, wherein the first conductive layer is located directly on the substrate.

3. The display panel of claim 1, wherein the first thin-film transistor comprises a first semiconductor layer comprising a silicon-based semiconductor, a first gate electrode at least partially overlapping the first semiconductor layer, and a first electrode layer disposed on the first gate electrode, and wherein the bottom metal layer is located between the first semiconductor layer and the substrate to at least partially overlap the first semiconductor layer.

4. The display panel of claim 3, wherein the first conductive layer and the bottom metal layer are located on a same layer.

5. The display panel of claim 3, wherein the bottom metal layer comprises molybdenum (Mo).

6. The display panel of claim 5, wherein the bottom metal layer comprises a same material as a material of the first gate electrode.

7. The display panel of claim 3, further comprising a bridge layer located on the first conductive layer and the emission control lines,
wherein the bridge layer connects one of the emission control lines and the first conductive layer.

8. The display panel of claim 7, wherein the bridge layer comprises a same material as a material of the first electrode layer.

9. The display panel of claim 7, wherein the emission control lines comprise a same material as a material of the first gate electrode.

10. The display panel of claim 3, wherein the pixel circuit further comprises a second thin-film transistor and a storage capacitor, and
wherein the second thin-film transistor comprises an oxide-based semiconductor.

11. The display panel of claim 10, wherein the second thin-film transistor comprises a second semiconductor layer, a second gate electrode at least partially overlapping the second semiconductor layer, and a second electrode layer disposed on the second gate electrode, and
wherein the storage capacitor comprises a lower electrode that is a part of the first gate electrode and an upper electrode disposed on the lower electrode to overlap the lower electrode in a plan view.

12. The display panel of claim 11, wherein the first gate electrode, the upper electrode, and the second gate electrode are located on different layers and comprise a same material.

13. The display panel of claim 1, further comprising an emission control driving circuit located in a first peripheral area surrounding the display area,
wherein the emission control lines receive a signal from the emission control driving circuit.

14. The display panel of claim 13, wherein the plurality of pixels comprise a first pixel located in a display area between the first opening and the first peripheral area, a second pixel located in a separation area between the first opening and the second opening, and a third pixel located in a display area between the second opening and a second peripheral area which is disposed opposite to the first peripheral area with the display area disposed between the first peripheral area and the second peripheral area, and
wherein the emission control lines are electrically connected to the first pixel, the second pixel, and the third pixel.

15. The display panel of claim 14, wherein the emission control lines comprise a first portion located in the display area between the first opening and the first peripheral area and electrically connected to the first pixel, a second portion located in the separation area between the first opening and the second opening and electrically connected to the second pixel, and a third portion located in the display area between the second opening and the second peripheral area and electrically connected to the third pixel.

16. The display panel of claim 15, wherein the first conductive layer bypassing the first opening is electrically connected to the first portion and the second portion.

17. The display panel of claim 15, wherein the first conductive layer bypassing the second opening is electrically connected to the second portion and the third portion.

18. The display panel of claim 1, further comprising:
first scan lines located on the substrate and extending in the first direction; and
a second conductive layer located in the intermediate area to bypass the first opening and the second opening,
wherein the second conductive layer electrically connects the first scan lines that are spaced apart from each other by the first opening and the second opening.

19. The display panel of claim 18, wherein the second conductive layer comprises a first layer and a second layer located on the first layer and electrically connected to the first layer.

20. The display panel of claim 19, wherein the first thin-film transistor comprises a first semiconductor layer, a first gate electrode at least partially overlapping the first semiconductor layer, and a first electrode disposed on the first gate electrode, and
wherein the first layer comprises a same material as a material of the first gate electrode.

21. The display panel of claim 19, wherein the pixel circuit further comprises a second thin-film transistor comprising a second semiconductor layer, a second gate electrode at least partially overlapping the second semiconductor layer, and a second electrode layer disposed on the second gate electrode, and
wherein the second layer comprises a same material as a material of the second gate electrode.

22. The display panel of claim 1, wherein a constant voltage is applied to the bottom metal layer.

23. An electronic device comprising:
a display panel comprising a display area and at least two opening areas that are located inside the display area and are spaced apart from each other; and
a component overlapping the at least two opening areas,
wherein the display panel comprises:
a substrate comprising a first opening and a second opening respectively corresponding to the at least two opening areas;
a plurality of pixels located in the display area around the first opening and the second opening, and each comprising a pixel circuit comprising a first thin-film transistor and a display element connected to the pixel circuit;
a bottom metal layer located between the substrate and the first thin-film transistor;
emission control lines located on the substrate, extending in a first direction, and spaced apart from each other by the first opening and the second opening; and
a first conductive layer located in the intermediate layer surrounding each of the first opening and the second opening to bypass the first opening and the second opening,
wherein the first conductive layer electrically connects the emission control lines that are spaced apart from each other by the first opening and the second opening, and comprises a same material as a material of the bottom metal layer.

24. The electronic device of claim 23, wherein the first conductive layer is located directly on the substrate.

25. The electronic device of claim 23, wherein the first conductive layer and the bottom metal layer are located on a same layer.

\* \* \* \* \*